(12) United States Patent
Wang et al.

(10) Patent No.: US 12,463,594 B2
(45) Date of Patent: Nov. 4, 2025

(54) POWER AMPLIFIERS AND METHODS OF CONTROLLING SAME

(71) Applicant: Georgia Tech Research Corporation, Atlanta, GA (US)

(72) Inventors: Fei Wang, Atlanta, GA (US); Justin Romberg, Atlanta, GA (US); Hua Wang, Atlanta, GA (US); Shaojie Xu, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 610 days.

(21) Appl. No.: 17/801,285

(22) PCT Filed: Feb. 21, 2021

(86) PCT No.: PCT/US2021/018946
§ 371 (c)(1),
(2) Date: Aug. 22, 2022

(87) PCT Pub. No.: WO2021/168385
PCT Pub. Date: Aug. 26, 2021

(65) Prior Publication Data
US 2023/0118004 A1 Apr. 20, 2023

Related U.S. Application Data

(60) Provisional application No. 62/979,894, filed on Feb. 21, 2020.

(51) Int. Cl.
*H03F 1/02* (2006.01)
*G05B 13/02* (2006.01)

(52) U.S. Cl.
CPC ....... *H03F 1/0288* (2013.01); *G05B 13/0265* (2013.01); *H03F 1/0222* (2013.01); *H03F 2201/3233* (2013.01)

(58) Field of Classification Search
CPC ............. H03F 1/0288; H03F 1/0222; H03F 2201/3233; H03F 2200/451; H03F 3/195;
(Continued)

(56) References Cited

U.S. PATENT DOCUMENTS

2012/0223774 A1  9/2012  Southcombe et al.
2018/0302042 A1  10/2018  Zhang et al.

FOREIGN PATENT DOCUMENTS

WO      2016/206891 A1    12/2016

OTHER PUBLICATIONS

International Search Report and Written Opinion from Application No. dated Jun. 9, 2021.
(Continued)

*Primary Examiner* — Andrea Lindgren Baltzell
*Assistant Examiner* — Khiem D Nguyen
(74) *Attorney, Agent, or Firm* — Troutman Pepper Locke LLP; Ryan A. Schneider; Harrison D. Lawrence

(57) ABSTRACT

An embodiment of the present disclosure relates to a method of controlling a power amplifier (PA). The PA can comprise a main PA path and an auxiliary PA path. The auxiliary PA path can have a plurality of turn-on settings. The method can comprise: determining a power back off gain and a lower bound gain for the PA; and performing an iterative auxiliary PA turn-on setting selection process. The selection process can comprise: determining an instantaneous power input to the PA; based on the instantaneous power input, choosing a turn-on setting in the plurality of turn-on settings of the auxiliary PA path that causes an instantaneous gain of the PA to be between the power back off gain and the lower bound gain; and applying the chosen turn-on setting to the auxiliary PA path.

18 Claims, 19 Drawing Sheets

(58) Field of Classification Search
CPC .............. H03F 3/245; G05B 13/0265; H03G 2201/307; H03G 3/3042
USPC ............................................ 330/124 R, 295
See application file for complete search history.

(56) References Cited

OTHER PUBLICATIONS

Wang, et al., "An Artificial-Intelligence (AI) Assisted Mm-Wave Multi-Band Doherty Transmitter," Mar. 25, 2019 https://apps.dtic.mil/sti/pdfs/AD1075554.pdf.

Xu, et al., "In-Field Performance Optimization for mm-Wave Mixed-Signal Doherty Power Amplifiers: a Bandit Approach," Sep. 22, 2020 https://ieeexplore.ieee.org/document/9204377.

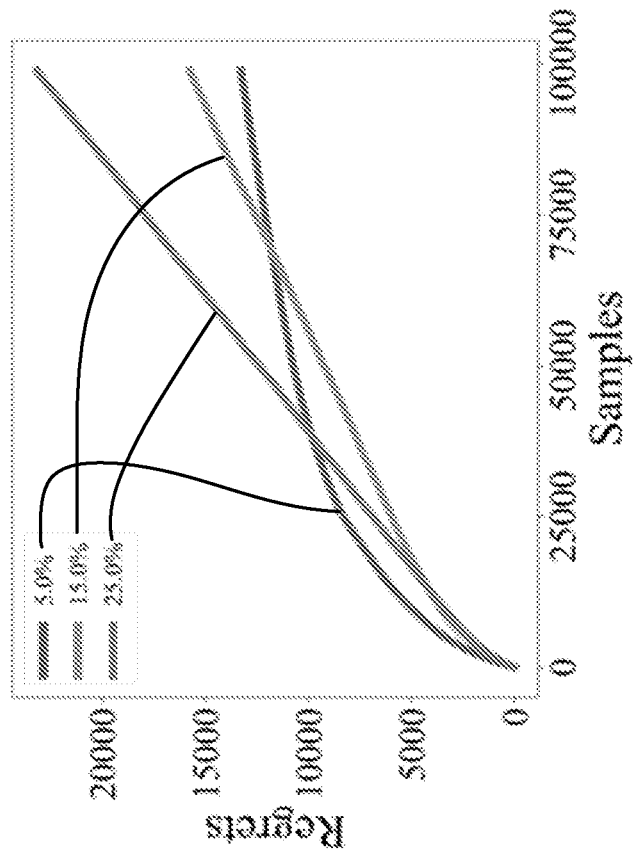
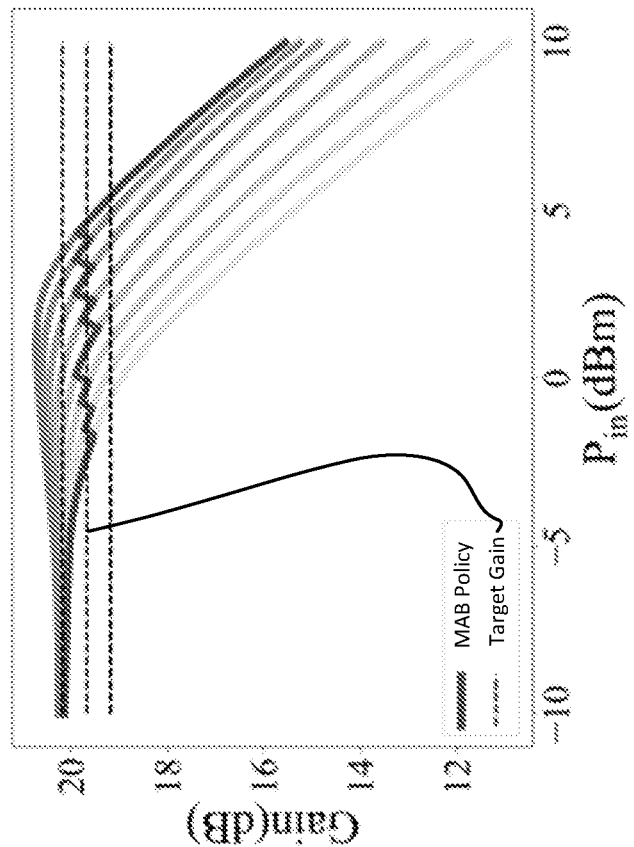
FIG. 5B
FIG. 5A

POWER AMPLIFIERS AND METHODS OF CONTROLLING SAME

CROSS-REFERENCE TO RELATED APPLICATIONS

This application claims the benefit of U.S. Provisional Application Ser. No. 62/979,894, filed on 21 Feb. 2020, which is incorporated herein by reference in its entirety as if fully set forth below.

FIELD OF THE DISCLOSURE

The various embodiments of the present disclosure relate generally to power amplifiers, and more particularly to Doherty power amplifiers and methods of controlling the same.

BACKGROUND

The rapid growth of fifth generation (5G) communication has posed increasingly demanding performance challenges on future wireless front-ends, including wide and noncontiguous bandwidth, sufficient transmitter output power, adequate receiver dynamic range, high linearity, and high energy efficiency. Advanced transmitter (TX) and power amplifier (PA) architectures are highly desired for communication applications where high peak-to-average power ratio (PAPR) waveforms are extensively employed. Recently, the Doherty TX/PA architecture has gained much attention due to its high efficiency at power back-off (PBO), large modulation bandwidth, and low baseband overhead. However, the PBO efficiency and the linearity of Doherty TXs/PAs are highly sensitive to the auxiliary (Aux) PA onset power and the load modulation between the Main and Aux paths. The Doherty load modulation relationship often varies drastically over antenna's impedance mismatch, necessitating complicated calibrations over single-branch PAs. It has been reported that re-configuring the Main/Aux PA settings in a Doherty PA can restore the PA performance under different antenna voltage standing wave ratios (VSWRs).

Circuit and system level self-testing, calibrations, and reconfigurations to enable front-end adaptivity and performance restoration also becomes essential for complex mobile applications. Wireless front-ends often need to operate in congested and constantly varying electromagnetic and thermal environments while still maintaining high performance and reliable wireless links. Although extensive work has been done on built-in-self-testing and online front-end calibrations, existing approaches often rely on extensive back-end computations and exhaustive sweeps on possible circuit configurations to control the front-end settings and then optimize frontend performance. These approaches are not suitable for many emerging applications which require ultra-low latency and fast response capabilities. This is particularly an issue for PAs in 5G multiple-input and multiple-output (MIMO) systems. The PA's performance, including power gain, linearity, efficiency, and reliability, highly depends on its load impedance. MIMO antenna array operations inevitably introduce cross-element coupling and result in different load mismatch (VSWR) for each PA. Meanwhile, many 5G applications require ultra-low latency, leaving exceedingly limited latency budget for PA load/performance calibration.

Accordingly, there is a need for improved PAs and control algorithms that achieve higher degree of linearity in the PA's gain response while maintaining high efficiency across a variety of environmental states. Embodiments of the present disclosure can address this need.

BRIEF SUMMARY

The present disclosure relates to power amplifiers and methods of controlling power amplifiers. An exemplary embodiment of the present disclosure provides a method of controlling a power amplifier (PA). The PA can comprise a main PA path and an auxiliary PA path. The auxiliary PA path can have a plurality of turn-on settings. The method can comprise: determining a power back off gain and a lower bound gain for the PA; and performing an iterative auxiliary PA turn-on setting selection process. Performing an iterative auxiliary PA turn-on setting selection process can comprise: determining an instantaneous power input to the PA; based on the instantaneous power input, choosing a turn-on setting in the plurality of turn-on settings of the auxiliary PA path that causes an instantaneous gain of the PA to be between the power back off gain and the lower bound gain; and applying the chosen turn-on setting to the auxiliary PA path.

In any of the embodiments disclosed herein, the method can further comprise selecting a target gain for the amplifier, wherein the chosen turn-on setting in the plurality of turn-on settings can be the turn-on setting in the plurality of turn-on settings that minimizes the difference between the target gain and the instantaneous gain of the PA.

In any of the embodiments disclosed herein, the PA can further comprise memory for storing a look-up table, wherein the look-up table comprises a turn-on setting for the auxiliary PA path to be chosen for a plurality of potential power inputs to the PA.

In any of the embodiments disclosed herein, the step of choosing the turn-on setting can comprise choosing the turn-on setting associated with the potential power input in the look-up table that corresponds to the instantaneous power input.

In any of the embodiments disclosed herein, the method can further comprise iteratively updating the look-up table based on current operating conditions of the PA.

In any of the embodiments disclosed herein, iteratively updating the look-up table can utilize a multi-armed bandit optimization process.

In any of the embodiments disclosed herein, the multi-armed bandit optimization process can comprise: dividing the plurality of potential power inputs into a low power input region and a high power input region; dividing the high power input region into a plurality of learning regions; initializing a reward estimation for each of the plurality of learning regions; obtaining the instantaneous power input corresponding to a region in the plurality of learning regions; selecting a turn-on setting in the plurality of turn-on settings for the instantaneous power input that maximizes the reward estimation; applying a turn-on setting to the auxiliary PA path that is one of the selected turn-on setting and a turn-on setting in the plurality of turn-on settings other than the selected turn-on setting; observing an updated instantaneous gain of the PA; and updating the rewards estimation.

In any of the embodiments disclosed herein, iteratively updating the look-up table can utilizes a contextual continuum-arm bandit optimization process.

In any of the embodiments disclosed herein, the contextual continuum-arm bandit optimization process can comprise: dividing the plurality of potential power inputs into a low power input region and a high power input region;

dividing the high power input region into a plurality of learning regions; defining a reward approximation function for each of the plurality learning regions; in each of the plurality of regions, initializing reward model parameters for the reward approximation functions; obtaining the instantaneous power input corresponding to a region in the plurality of learning regions; selecting a turn-on setting in the plurality of turn-on settings for the instantaneous power input that maximizes the reward approximation function corresponding to the learning region for the instantaneous power input; applying a turn-on setting to the auxiliary PA path that is one of the selected turn-on setting and a turn-on setting in the plurality of turn-on settings other than the selected turn-on setting; observing an updated instantaneous gain of the PA; and updating the reward model parameters using a regression analysis.

In any of the embodiments disclosed herein, iteratively updating the look-up table can utilize an actor-critic optimization process.

In any of the embodiments disclosed herein, the actor-critic optimization process can comprise: dividing the plurality of potential power input levels into a low power input region and a high power input region; dividing the high power input region into a plurality of learning regions; defining a reward approximation function for each of the plurality of learning regions; defining a policy function across all of the plurality of learning regions; in each of the plurality of regions, initializing reward model parameters for reward approximation functions; obtaining the instantaneous power input corresponding to a region in the plurality of learning regions; selecting a turn-on setting in the plurality of turn-on settings for the instantaneous power input based on a policy function; applying a turn-on setting to the auxiliary PA path that is one of the selected turn-on setting and a turn-on setting in the plurality of turn-on settings other than the selected turn-on setting; observing an updated instantaneous gain of the PA; updating the reward model parameters using a regression analysis; and updating parameters for the policy function using a regression analysis.

In any of the embodiments disclosed herein, the plurality of turn-on settings can comprise eight distinct turn-on settings.

In any of the embodiments disclosed herein, the PA can be a mm-wave mixed-signal Doherty PA.

Another embodiment of the present disclosure provides a PA comprising: an input network configured to receive a power input signal; an output network configured to output a power output signal; a main PA path; an auxiliary PA path, the auxiliary PA path having a plurality of turn-on settings; and a PA controller configured to implement a PA control algorithm. The PA control algorithm can comprise: determining a power back off gain and a lower bound gain for the PA; and performing an iterative auxiliary PA turn-on setting selection process. Performing an iterative auxiliary PA turn-on setting selection process can comprise: determining an instantaneous power level for the power input signal; based on the instantaneous power level, choosing a turn-on setting in the plurality of turn-on settings of the auxiliary PA path that causes an instantaneous gain of the PA to be between the power back off gain and the lower bound gain; and applying the chosen turn-on setting to the auxiliary PA path.

In any of the embodiments disclosed herein, the PA control algorithm can further comprise selecting a target gain for the amplifier, wherein the chosen turn-on setting in the plurality of turn-on settings can be the turn-on setting in the plurality of turn-on settings that minimizes the difference between the target gain and the instantaneous gain of the PA.

In any of the embodiments disclosed herein, the PA can further comprise memory for storing a look-up table, wherein the look-up table can comprise a turn-on setting for the auxiliary PA path to be chosen for a plurality of potential power input levels for the power input signal.

In any of the embodiments disclosed herein, the step of choosing the turn-on setting can comprise choosing the turn-on setting associated with the potential power input level in the look-up table that corresponds to the instantaneous power level.

In any of the embodiments disclosed herein, the PA control algorithm can further comprise iteratively updating the look-up table based on current operating conditions of the PA.

These and other aspects of the present disclosure are described in the Detailed Description below and the accompanying drawings. Other aspects and features of embodiments will become apparent to those of ordinary skill in the art upon reviewing the following description of specific, exemplary embodiments in concert with the drawings. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments discussed herein. In similar fashion, while exemplary embodiments may be discussed below as device, system, or method embodiments, it is to be understood that such exemplary embodiments can be implemented in various devices, systems, and methods of the present disclosure.

BRIEF DESCRIPTION OF THE DRAWINGS

The following detailed description of specific embodiments of the disclosure will be better understood when read in conjunction with the appended drawings. For the purpose of illustrating the disclosure, specific embodiments are shown in the drawings. It should be understood, however, that the disclosure is not limited to the precise arrangements and instrumentalities of the embodiments shown in the drawings.

FIG. 2A illustrates performance under standard 50 ohm VSWR=(1,0°). FIG. 2B illustrated under VSWR of magnitude 2 and reflection coefficient angle 180°, VSWR=(2,180°).

FIGS. 5A-B provide simulation results of a MAB-based control algorithm in a time-invariant environment, in accordance with an embodiment of the disclosure. FIG. 5A provides the learned policy after 10,000 samples with 10% exploration rate. FIG. 5B provides cumulative regrets under various exploration rates.

DETAILED DESCRIPTION

Figure 1:
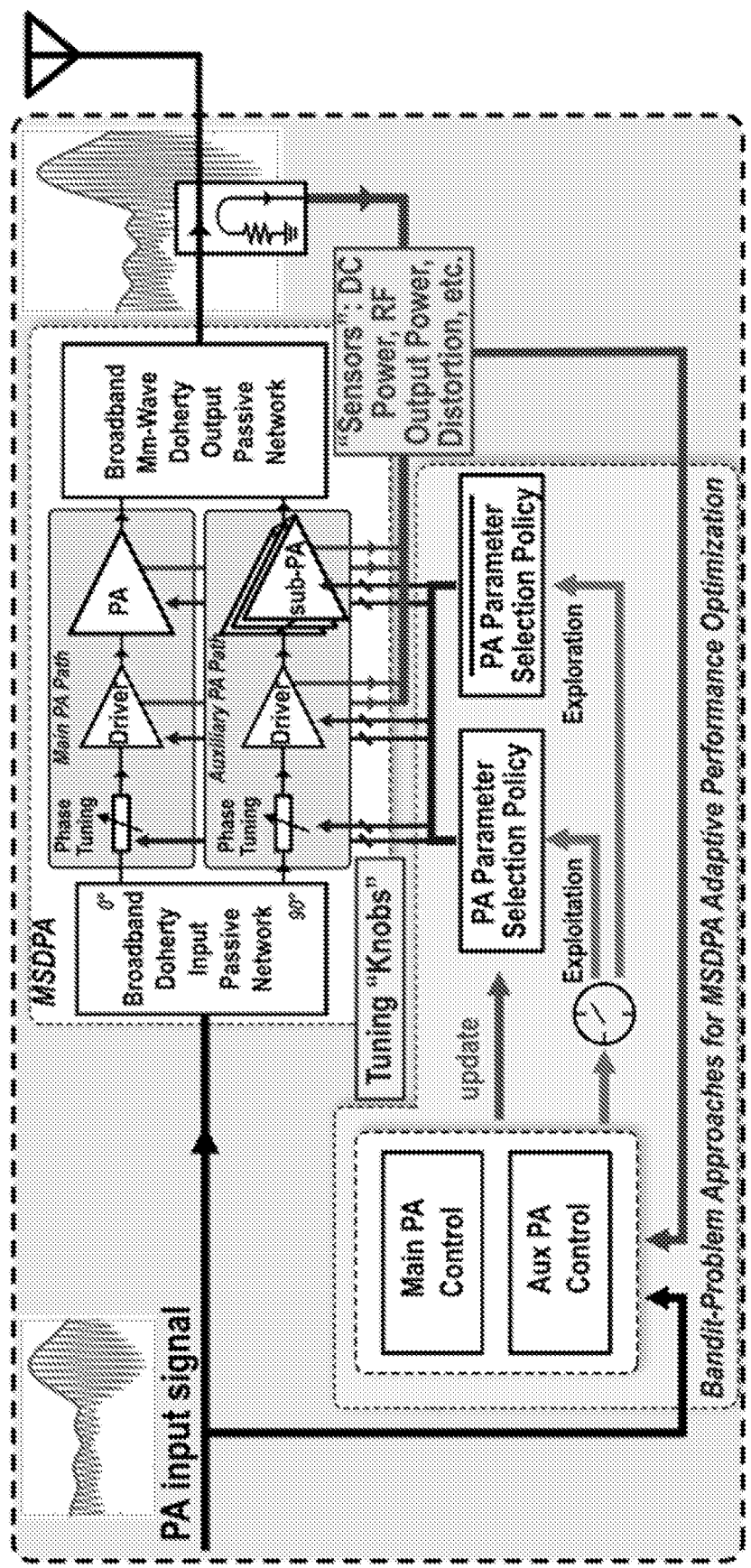
FIG. 1 provides a conceptual diagram of a Doherty PA, in accordance with an embodiment of the disclosure.

To facilitate an understanding of the principles and features of the present invention, various illustrative embodiments are explained below. The components, steps, and materials described hereinafter as making up various elements of the embodiments disclosed herein are intended to be illustrative and not restrictive. Many suitable components, steps, and materials that would perform the same or similar functions as the components, steps, and materials described herein are intended to be embraced within the scope of the disclosure. Such other components, steps, and materials not described herein can include, but are not limited to, similar components or steps that are developed after development of the embodiments disclosed herein.

The present disclosure relates to PAs and control algorithms for improving the performance of PAs. The previous work on improving the PA's performance can be summarized into two categories. The first category is to design a reconfigurable PA at the circuit level and provide adjustable hardware settings to control the PA's behavior. Various sensors are incorporated into the architecture to measure power, efficiency, and temperature either explicitly or implicitly. Based on the measurements, the control unit adjusts the PA settings to match certain performance criteria. One common goal of this approach is to correct the specification mismatch inevitably introduced by process-voltage-temperature (PVT) variations. The PA architecture design which aims to calibrate the PA's behavior is known as self-healing. Although the self-healing architecture contains a feed-back control loop, the performance optimization is carried out in a designated calibration stage. A testing signal is sent to the PA during the calibration process. The control algorithm optimizes the PA's performance by either sweeping through the PA settings or applying gradient-based optimization algorithms.

In order to achieve true in-field PA performance optimization, several changes need to be introduced to the self-healing architecture. Self-healing often aims to optimize multiple performance aspects simultaneously, which may not be achievable given the time and computational budget of an online control algorithm. Sensor design is also crucial for infield PA control, as the sensors must be able to provide timely and accurate measurements. Furthermore, the efficiency of the control algorithm needs to be improved in order to adapt the control policy to environmental changes. As demonstrated below, the efficiency improvement often comes from leveraging the prior knowledge of the PA's behavior.

Dynamic PA hardware control to improve power efficiency has been explored previously, where both the PA architectures and the control settings are relatively simple, and the algorithms can be realized at the circuit level. In-field linearization and efficiency optimization for Doherty PA was proposed, where the PA's behavior is approximated by polynomial functions within the feedback control unit.

Other dynamic linearization techniques for Doherty PAs have focused on digital predistortion (DPD). DPD is another popular class of methods to enhance PAs' performance. Input signals are pre-distorted before passing through the PA in order to compensate the PA's distortion, thus achieving extended linear response and high-power efficiency. Mathematically, DPD models the PA's distortion as a complex function and seeks to construct a system that approximates its inverse function. For a memoryless PA whose output only depends on the current input and not the history of the inputs, the PA's behavior can be fully described by gain response curves and phase response curves.

One advantage of the DPD is its ability to address the memory effect of the PA system, where the PA output is assumed to be dependent on the input history. The memory effect causes the PA's transfer function to vary with the modulation frequency. The Wiener model and memory polynomial model are two popular memory effect models. Recent developments in neural networks also lead the researchers to leverage on the neural networks' powerful function approximation ability to model both PAs and their corresponding DPD systems. By pre-distorting the input signal, DPD does not reconfigure or optimize the hardware itself. Rather than improving the backoff efficiency or linearity of a given Doherty PA hardware, it reshapes the input signal to work with the nonlinear PA hardware to allow maximum power amplification and minimize the additional power backoff levels.

DPD techniques and the control algorithms disclosed herein complement each other. The control algorithms disclosed herein can optimize the PA's performance by updating the hardware settings, while DPD modifies the input signal. The control algorithms disclosed herein can perform independently from DPD, while DPD treats the PA with the control algorithms disclosed herein running as one single hardware entity. The control algorithms disclosed herein can minimize the PA distortion in the hardware level, reducing the workload of the DPD unit. On the other hand, DPD alleviates the memory effect of the PA and compensates for the memoryless assumption in our proposed algorithms. Both the proposed PA control and the online DPD algorithms can be fully adaptive to environmental changes.

Recent developments in reinforcement learning (RL) provide new insights for designing control algorithms. Within the field of RL, bandit problems focus on choosing the actions that generate maximum expected reward. The bandit framework assumes the actions to have no lasting impact on the system and is, therefore, suitable for designing control algorithms for memoryless systems. Early successes have been reported in applications such as solar panel control, wireless communication management, internet of things, cyber security, and mobile health. When memory effect has to be considered in the system, promising results have been reported in designing control algorithms using Markov-decision-process (MDP)-based RL frameworks.

Disclosed herein, however, are embodiments which can employ the first fully adaptive hardware control algorithm that linearizes the Doherty PA hardware. Some embodiments also constitute the first Doherty PA system with bandit/RL-based controls. The learning nature of the bandit-RL frameworks can allow these embodiments to adapt to environmental changes and maintain robust performance. We incorporate the properties of the Doherty PA into the algorithm design to achieve high learning efficiency and fast adaption rate.

As shown in FIG. 1, an exemplary embodiment of the present disclosure provides an AI-assisted mm-wave Doherty PA, where a mixed-signal Doherty PA (MSDPA) serves as the hardware demonstration platform for the control algorithm. The signal path can be divided into a main PA (Main PA) path and an auxiliary PA (Aux PA) path, each providing a number of digital turn-on settings to control its behavior. The control unit can adjust these turn-on settings to achieve linear gain response and high power efficiency. As the PA's behavior changes with environmental variables, a closed-loop control algorithm can be employed by the control unit to dynamically update the turn-on setting selection policy, so that the optimal performance is maintained.

Detailed description about each component in the exemplary embodiment is provided below.

Mixed-Signal Doherty PA

The MSDPA can employs a hybrid use of an analog PA and a binary-weighted digitally controlled PA in its main and auxiliary paths respectively. The MSDPA can combine the advantages of the high linearity of the main analog PA and the flexible reconfigurability of the auxiliary digital PA, while overcoming their intrinsic limitations. The MSDPA can be driven by a generic complex-modulated signal that has both phase and envelope modulations. Based on the real-time AM envelope, MSDPA's Doherty operation can turn on different weightings of the auxiliary digital PA. For small input envelopes, the MSDPA can operate in its analog regime, turning on only the main analog PA. For large input envelopes, the MSDPA can operate in its mixed-signal regime. The sub-PAs in the auxiliary path can be dynamically turned on to prevent main PA from clipping or saturation. In this way the PA's linear operation range can be extended. The overall MSDPA can achieve a high linear output power and an efficiency boost through its Doherty operation.

Main/Aux PA Turn-on Settings

Figure 2B:
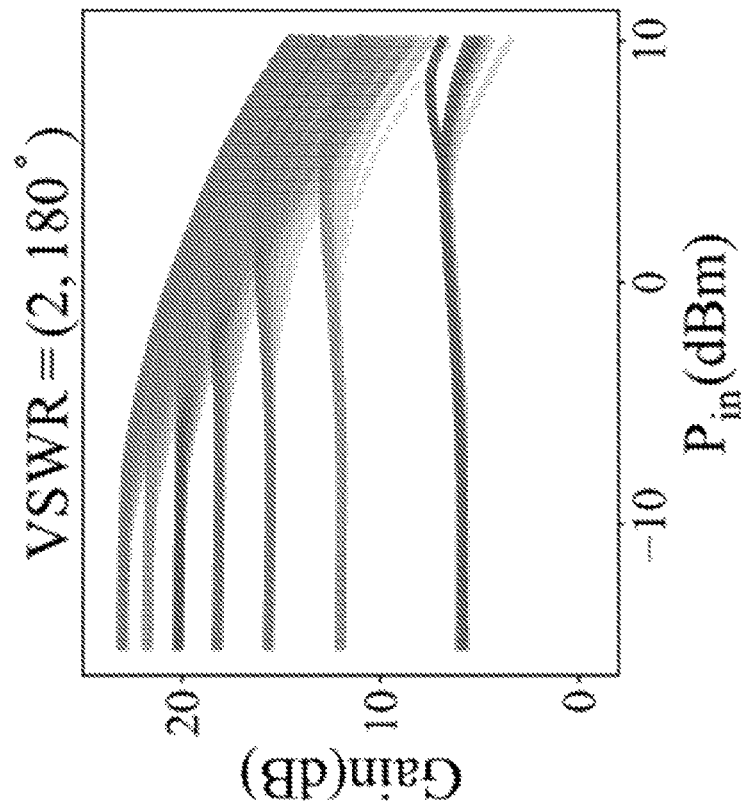
FIGS. 2A-B provide gain responses of an exemplary Doherty PA under different turn-on settings, in accordance with an embodiment of the disclosure. Main PA path turn-on settings are indicated by different groupings, while different Aux PA turn-on settings are indicated by different intensity within the groupings.
Figure 2A:
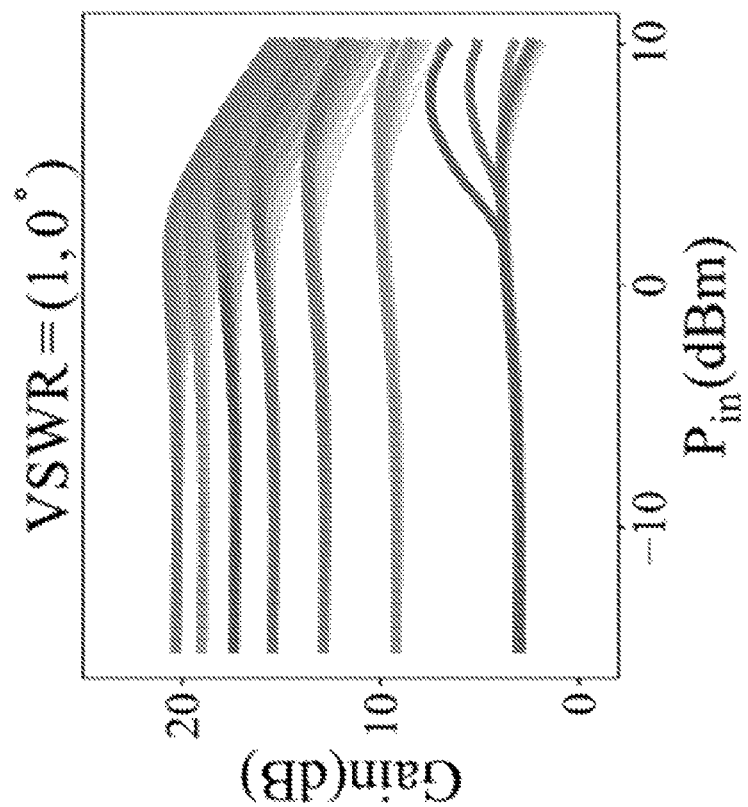

The Doherty PA can provide two sets of controls: Main and Aux path PA turn-on settings. Each control setting can lead to unique gain/phase responses and PA efficiency (PAE). FIG. 2 shows the gain responses under different Main/Aux PA turn-on settings measured from transistor-level simulations with extracted post-layout parasitics for an exemplary embodiment. There are seven Main PA turn-on settings and eight Aux PA turn-on settings in total. Each Main PA turn-on setting corresponds to one group in FIG. 2. Given one Main PA setting, the gain responses under different Aux PA settings are plotted in the same group with different intensity. Comparing FIGS. 2A and 2B shows how the change in VSWR affects the PA's gain response. VSWR measures the output impedance mismatch and is defined as:

$$VSWR = \frac{1 + |\Gamma|}{1 - |\Gamma|} \quad \text{Equation 1}$$

where $\Gamma$ is the reflection coefficient which can be calculated as:

$$\Gamma = |\Gamma|e^{j\theta_\Gamma} = \frac{Z_L - R_0}{Z_L + R_0}, \quad \text{Equation 2}$$

where $Z_L$ is the load impedance and Ro is the characteristic impedance. Under different VSWR mismatch, different PA turn-on settings can result in different linear operation range. Due to the sensitivity of the performance of the PA to the environmental conditions, embodiments of the present disclosure provide efficient adaptive control algorithms.

As discussed in more detail below, the PA turn-on settings can be adjusted by an AI-assisted feed-back control unit which can aim to achieve the extended linear gain region. The control can be performed in two stages, selecting the Main and Aux PA turn-on settings, respectively. Under a fixed Main PA setting, the gain responses under different Aux PA settings for an exemplary embodiment are demonstrated in FIG. 3A. When the input power is low, the gain curves are flat and nearly stay the same under various Aux PA settings. This low input power region is known as the power back-off (PBO) region. As the input power increases, the PA starts to compress and the gain curves start to drop. The curves under small Aux PA settings drop faster than the ones under large Aux PA settings. The Aux PA setting can be increased to maintain the linearity, such that the gain is maintained between a power back off gain (shown by the upper horizontal dashed line in FIG. 3A) and a lower bound gain (shown by the lower horizontal dashed line in FIG. 3A). The control algorithms (discussed below) can seek to maintain the instantaneous gain of the PA at a linear target gain (shown in the horizontal dashed line in FIG. 4). The control algorithms can do this by selecting a turn-on setting for the Aux PA path that minimizes the difference between the target gain and the instantaneous gain of the Doherty PA. As discussed below, the turn-on settings can be stored in a look-up table on the PA, which is iteratively updated by the control algorithm to account for changes in the environment of the PA. Thus, for any particular instantaneous gain, a corresponding entry in the look-up table can provide a desired turn-on setting.

Figure 3A:
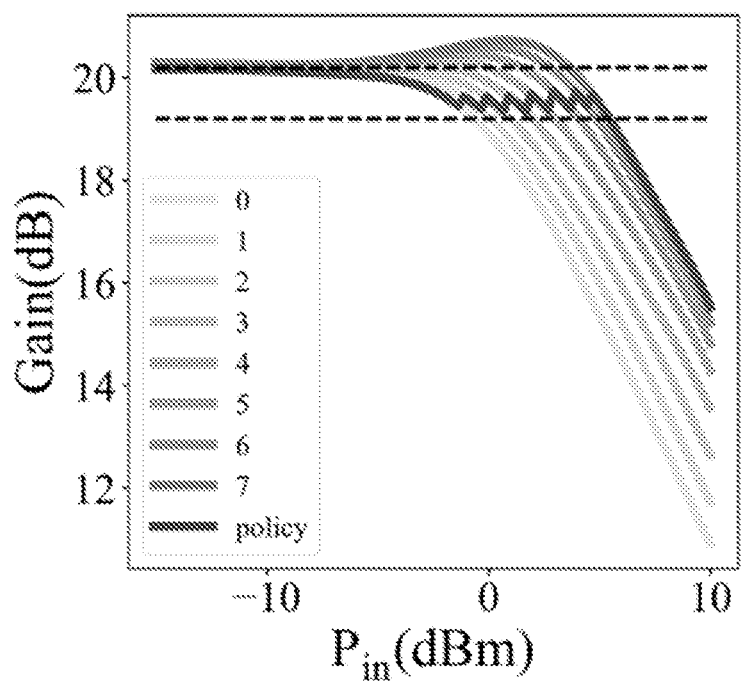
FIGS. 3A-C illustrate gain (FIG. 3A), phase (FIG. 3B), and PAE (FIG. 3C) under different Aux PA turn-on settings, in accordance with an embodiment of the disclosure. The VSWR is of standard 50 ohm and the Main PA turn-on setting is fixed to 6. The dark line in each figure provides an example of a desired policy which achieves extended linear gain region while maintaining high PAE.
Figure 3B:
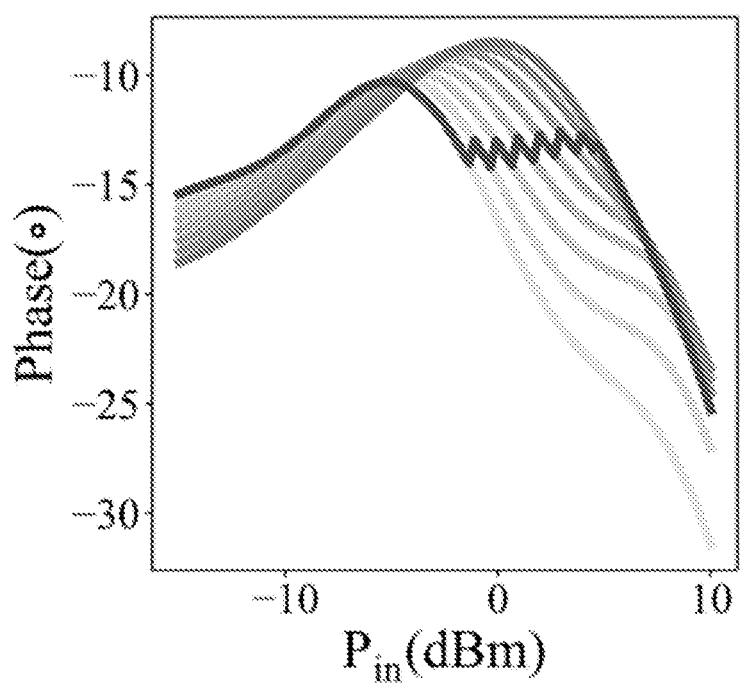
Figure 3C:
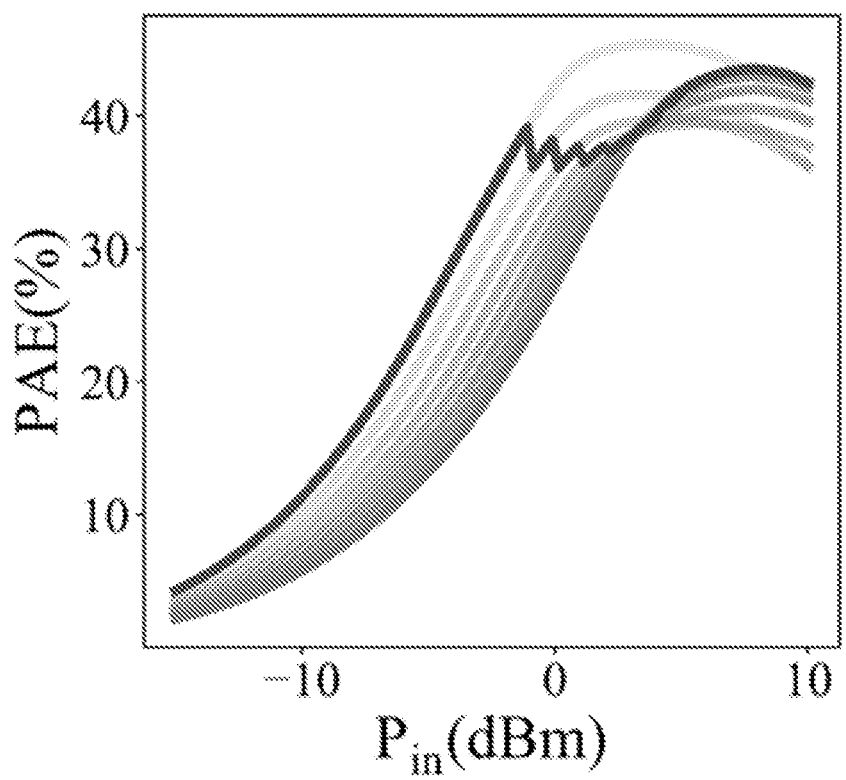

The phase responses and the PAE of a PA are shown in FIG. 3B and FIG. 3C, respectively. Although the largest linear gain region is achieved by fixing the Aux PA setting as 7, the PAE of this strategy can be significantly degraded. The shape of the gain curves and the PAE curves suggests that the Aux PA turn-on setting can be dynamically adjusted based on the input power in order to achieve extended linear region while maintaining high PAE.

We can formulate this Aux PA control as an optimization problem:

$$\max_a PAE(a) \text{ s.t. } |g(a) - g_{PBO}| \leq \delta, \quad \text{Equation 3}$$

where a is the Aux PA turn-on setting, g(•) is the achievable power gain under different Aux PA settings given an input. $g_{PBO}$ is the gain in the PBO region. $\delta$ is the small tolerance on the linearity. When no a satisfies the constraint, the Aux PA setting that maximizes the linearity can be chosen. The dark line in FIG. 3A shows a desired Aux PA control policy. Under this policy, the Aux PA turn-on setting is gradually increased as the input power increases. The increment can happen when the lower setting is more than 1 dB lower than the gain obtained in the PBO region in order to maintain high PAE. One can consider the dark line in FIG. 3A as the "synthesized" gain response under the Aux PA control. This policy's phase response and PAE are plotted in FIG. 3B and FIG. 3C respectively.

Under each Main PA setting, a "synthesized" gain response can be obtained by designing the Aux PA control. A criterion of selecting Main PA turn-on setting can be to choose the one that has the largest linear region in the synthesized gain response. Different from the Aux PA control, where the Aux PA setting can be selected based on the power of each input sample, the Main PA setting can be only changed when an environmental change is detected and the synthesized gain response can be improved by switching to another Main PA setting. In other words, in a time-invariant environment, the Main PA setting can be fixed, while the Aux PA setting can be dynamically adjusted by the control algorithm based on each input power. Below, we discuss exemplary algorithms for efficient control of the Aux PA turn-on settings. Each of these algorithms can be used to iteratively update the look-up table containing desired turn-on settings for a given instantaneous power input.

Aux PA Control as Bandit Problems

Closed-Loop Control

FIG. 2 demonstrates how environmental variables such as the load mismatch affect the PA's performance. In order to adapt the control policy to the environmental changes, a closed-loop control scheme can be implemented. As shown in FIG. 1, the control unit observes the PA input power and selects Main/Aux settings accordingly. The turn-on settings can be selected from a look-up table stored in memory of the PA. The PA output under the selected setting can be sensed and sent back to the control unit. Based on these input/output pairs, the control unit can learn the behavior of the PA and optimize the control policy. The control policy can be optimized when the control unit has good knowledge about how the PA performs under all settings. Therefore, some embodiments apply the idea of exploration and exploitation from reinforcement learning. Each time before sending the control signal to the PA, the control unit can choose between exploitation and exploration. In the exploitation stage, the PA receives the turn-on setting actually suggested by the control policy. In the exploration stage, the suggested turn-on setting is discarded and some other setting is sent to the PA in order for the control unit to gain broader knowledge about how PA behaves under various settings.

The exploration-exploitation scheme can be used for the PA to maintain optimal performance in a time-variant environment. Environmental changes can require the control unit to constantly re-estimate the PA's behavior. Constant control policy update can be handled naturally by the exploration-exploitation scheme. The situation when the current control policy is no longer the optimal under the new environment can be identified during the exploration stage, leading to a timely policy adjustment. The balance between exploration and exploitation can be affected by how fast the environment changes. When the PA is operating in an environment with known slow time-variance, the exploration rate can be small in order for the PA to follow the actual control policy. However, when the environment is known to change frequently, the exploration rate can be increased to encourage timely performance re-optimization. The exploration-exploitation scheme can allow for the elimination of the dedicated calibration stage found in many existing self-healing PA designs. By using the actual modulation signals with time-varying envelopes, the downtime can be minimized.

Control Algorithm Based on Multi-Armed Bandit

In some embodiments, the Aux PA control can be formulated as a bandit problem, such as a multi-armed bandit (MAB) problem. In such a MAB problem, an agent faces a set of actions A, and each action a∈A returns a stochastic reward r drawn from an unknown distribution. At each time t, the agent chooses one action at and receives a reward $r_t$ associated with that action. A goal of the agent can be to maximize the cumulative reward in a given time period. Essentially, the agent updates its estimation of the reward distribution based on the received rewards and acts based on the current estimation. Fitting the MAB framework into an Aux PA control, each Aux PA setting can be viewed as one action. As the control unit seeks to achieve the extended linear gain region while maintaining high PAE, how to design an exemplary reward function to reflect this criterion is explained below.

Figure 4:
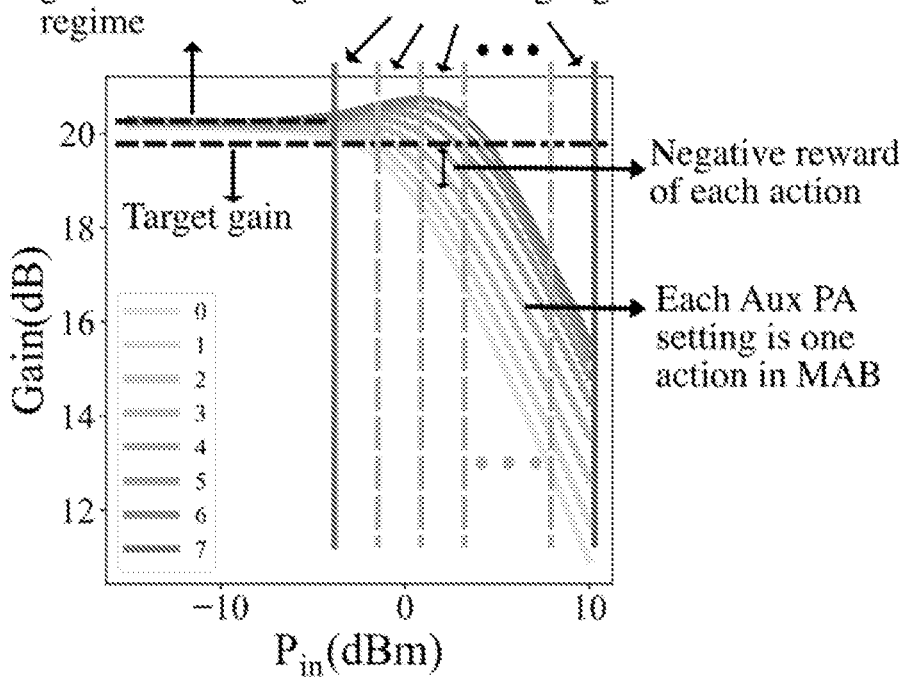
FIG. 4 provides the MAB arrangement to achieve the extended linear gain while maintaining high PAE, in accordance with an embodiment of the disclosure.
Figure 6B:
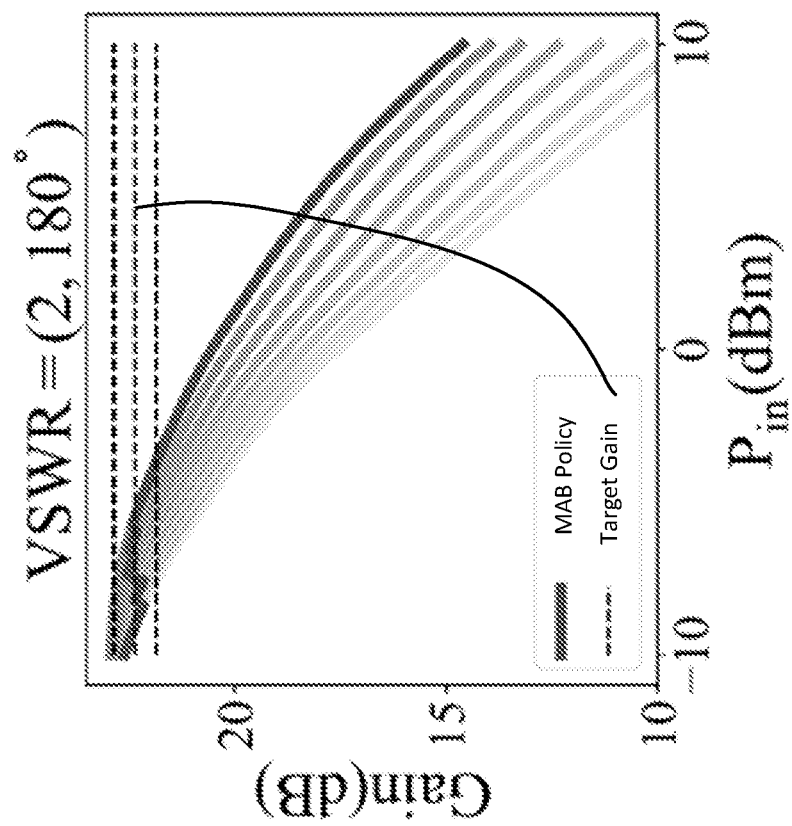
FIGS. 6A-D provide simulation results of an MAB-based control algorithm in a time-variant environment, in accordance with an embodiment of the disclosure. The angle of reflection coefficient is rotated in the order of 80, 180, 270, and 360 degrees. 25,000 samples are sent to the system after each rotation. The policy learned by the MAB-based control after every 25,000 samples are plotted in the dark lines in each figure.
Figure 6A:
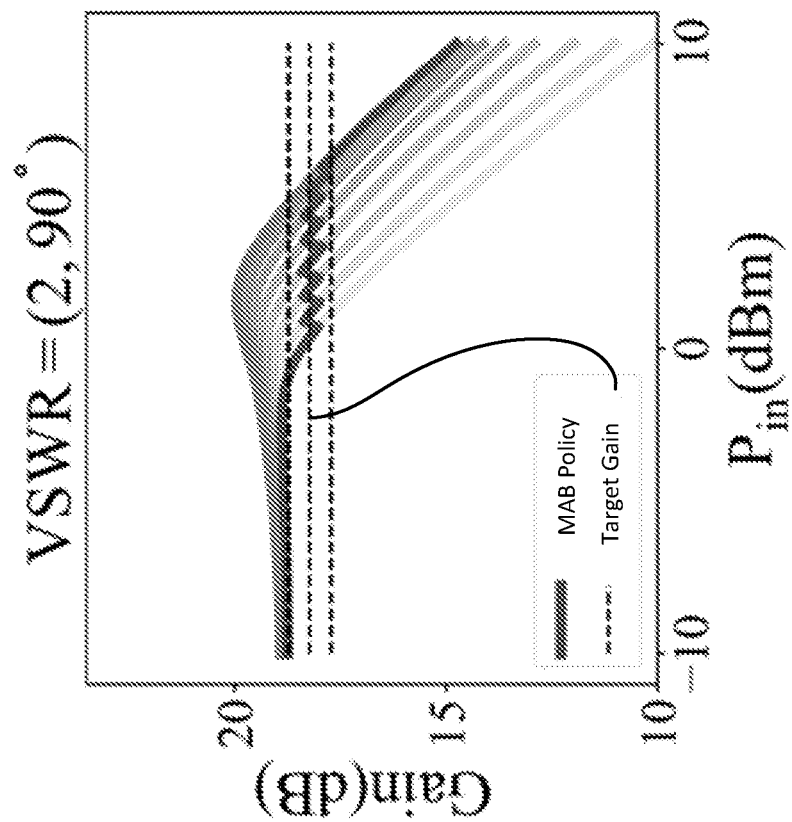
Figure 6D:
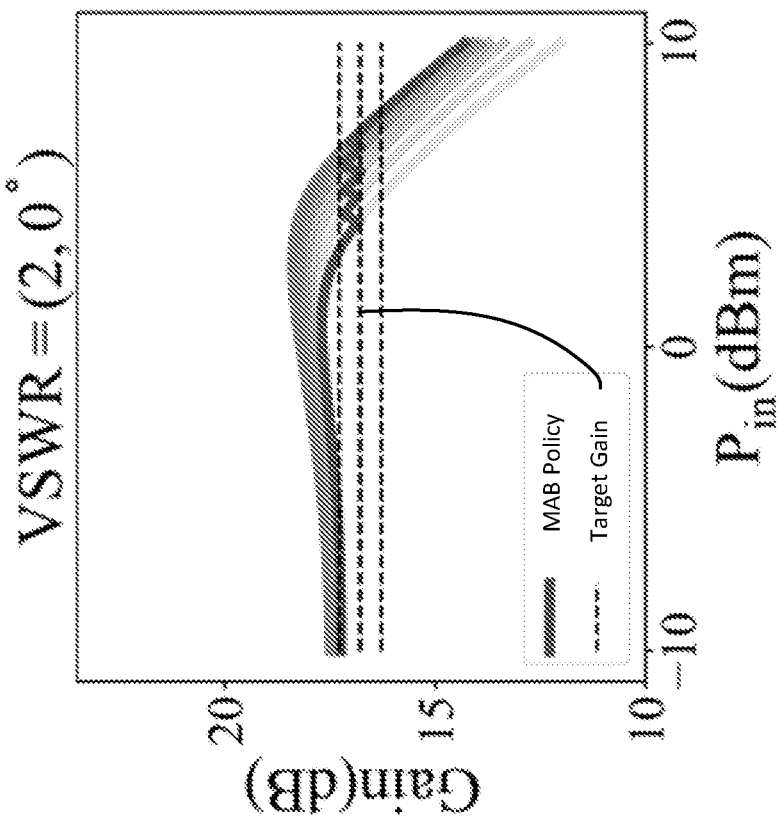
Figure 6C:
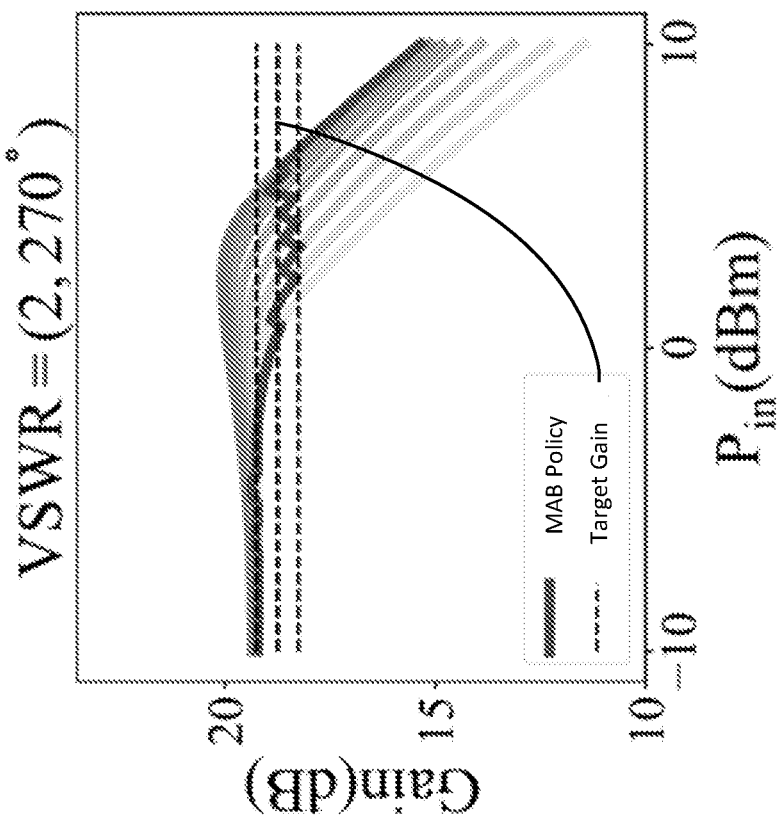

The Analog Regime vs. the Learning Regions in the Mixed-Signal Regime: Directly solving the optimization problem (3) can include measuring PAE in real time, which largely increases the system complexity and the sensor processing time. Fortunately, for a given mixed-signal Doherty PA at a given supply voltage condition, a higher output power setting typically results in a lower PAE. This ordering structure of the gain curves enables the design of an effective algorithm that can be only based on the measured input and output power levels. As shown in FIG. 3, the gain curves can behave differently cross the entire input power range. When the input power is low, the gain curves can be flat and nearly stay the same under various Aux PA turn-on settings. Therefore, the Aux PA turn-on setting can be fixed as 0 in this region to achieve the highest PAE, and the PA can operate in the analog regime. For large input power, the power gain curves can drop as the input power increases. As a result the optimal Aux PA turn-on setting can depend on the input power and the PA can operate in the mixed-signal regime. This mixed-signal regime can be divided into M "learning regions" and one MAB can be constructed for each region. FIG. 4 shows the overall MAB arrangement, for an exemplary embodiment. The length of each learning region can be chosen to reflect the local gain curve variations. Within each learning region $\mathcal{Z}^m$, the control unit can learn to choose the Aux PA turn-on setting that minimizes the gain distortion.

Reward Definition: A reference power gain E[g] from the analog regime can first be estimated, where the gain g can be viewed as a random variable following some distribution. Our estimation ğ for this reference gain can be calculated using stochastic approximation (SA). Specifically, when an input falls into the analog regime at time t, we apply the following update:

$$\tilde{g} \leftarrow \tilde{g} + \alpha_0(g_t - \tilde{g}),$$ Equation 4:

where $g_t$ is the observed power gain at time t and $\alpha_0 \in (0, 1]$ is the SA step size. Essentially, when the observation $g_t$ differs from the estimation ğ, Equation 4 makes a small adjustment to the estimation based on the difference. The closer the step size is to 1, the more weight is given to the recent observations. In a stationary setting where the power gain g follows some time-invariant distribution, SA can converge to the expectation E[g] asymptotically when the step size satisfies:

$$\sum_{t=1}^{\infty} a_t = \infty, \sum_{t=1}^{\infty} a_t^2 < \infty.$$ Equation 5

As our PA is operating in a time-variant environment, we set the update size to a fixed value $\alpha_0$ to constantly adjust the estimation by the most recent observation. Given a reference gain ğ estimated from the analog regime, the following reward function for the MAB regions can then be designed:

$$R_{MAB}^m(a) = -E[|g^m(a) - \hat{g}|],$$ Equation 6:

where $g^m(a)$ is the observed power gain under Aux PA setting a in region $\mathcal{Z}^m$, and ğ is the reference gain ğ adjusted by a small constant offset δ: $\hat{g} = \tilde{g} - \delta$. The offset can be added to encourage the algorithm to choose a lower Aux PA setting, and hence improving the PAE. The reward measures the negative of the expected absolute difference between the observed gain and the target gain $\hat{g}$. The control policy deduced by this reward can well approximate the solution of Equation 3.

Updating the Reward Estimation: With actions and rewards defined above, the control unit can treat each learning region as an independent MAB. During operation, the control unit can follow the exploration-exploitation scheme. At each time t, an input with power $s_t$ falls into one of the learning regions $\mathcal{Z}^m$. When exploitation is activated, the Aux PA turn-on setting suggested by the current reward estimation $a^* = \arg\max \hat{R}_{MAB}^m(a)$ can be used. When exploration is activated, a randomly selected action different from $a^*$ is used. At each time t, the power gain under the chosen setting $a_t$ is observed: $g_t = g^m(a_t)$, and the estimation for the reward function is updated using SA:

$$\hat{R}_{MAB}^m(a_t) \leftarrow \hat{R}_{MAB}^m(a_t) + \alpha(-|g_t - \hat{g}| - \hat{R}_{MAB}^m(a_t)),$$ Equation 7:

where a fixed value $\alpha \in (0, 1]$ can be used as the SA step size to adjust the estimation with the most recent observation. The amount of exploration can be determined by a fixed number $\epsilon \in (0, 1]$. At every step, the control unit can explore with probability and exploits with probability $1-\epsilon$, a scheme known as the $\epsilon$-greedy action selection. As a result, the control unit can learn one optimal Aux PA turn-on setting associated with each MAB learning region. Across different regions, the control unit can adjust the Aux PA turn-on setting according to the input power, achieving the extended linear gain response. The constant exploration and exploitation can ensure high performance in a time-variant environment. The complete exemplary MAB-based control algorithm is described in Algorithm 1.

---

Algorithm 1 Linear Gain Control 2 Algorithm Based on Multi-Armed Bandit

Divided the high input power region into M learning regions $\mathcal{Z}^1, \mathcal{Z}^2, \ldots, \mathcal{Z}^M$.
Initialize the reward estimations $\hat{R}_{MAB}^m(a)$ for each region.
Set stochastic approximation step size α.
Obtain the target gain value $\hat{g}$.
For each time t:
    Observe an input with power $s_t$ that falls into one of the regions $\mathcal{Z}_t = \mathcal{Z}^m$.
    Calculate the best action based on reward estimations:

$$a^* = \arg\max_a \hat{R}_{MAB}^m(a).$$

With probability $1 - \epsilon$:
        $a_t = a^*$.
    Otherwise:
        Randomly choose an action $a_t \neq a^*$.
    Apply action $a_t$ and observe gain $g_t$.
    Update the reward estimation:
        $\hat{R}_{MAB}^m(a_t) \leftarrow \hat{R}_{MAB}^b(a_t) - \alpha \, (|g_t - \hat{g}| + \hat{R}_{MAB}^m(a_t))$.

---

Testing and Results: The performance of the exemplary MAB-based algorithm in a time-invariant environment was tested. The testing was performed using software simulation. The PA's gain, phase, and PAE were first measured under different VSWR. As discussed above, these measurements were obtained from transistor-level simulations with extracted post-layout parasitics, and the commercially available GlobalFoundries 45 nm CMOS SOI process design kit was used to perform simulations. These data were used to create a PA simulator in Python. The VSWR was set to be under a standard 50 ohm load. 25 MAB learning regions were set up with input power from −10 dBm to 10 dBm. The analog regime had input power lower than −10 dBm. The target gain offset δ was set to be 0.5 dB. The exploration ratio was set as 10%, and the SA step size was set as 0.25 for both MAB update (α) and reference gain estimation ($\alpha_0$). The reward estimations in all the learning regions were initialized to −1. FIG. 5A shows the learned policy after 10,000 samples. The policy stayed within 1 dB range compared to the PBO gain estimated from the analog regime while holding on to the lower Aux PA turn-on settings to achieve higher PAE.

The convergence rate of the MAB-based control is shown in FIG. 5B. To quantify the convergence, the concept of regrets from the reinforcement learning literature was used. The cumulative regrets C is defined as:

$$C(T) = \sum_{t=0}^{T} r_t^o - r_t = \sum_{t=0}^{T} |g_t - \hat{g}| - \min_{a_t^o}|g(a_t^o) - \hat{g}|,$$ Equation 8 where $r_t^o$ is the reward that would have been received by the optimal policy (if had known) at time t, and $r_t$ is the reward actually received by the learning algorithm. At each time t, the gain obtained by the optimal policy has the minimal absolute difference to the target gain. Three different exploration rates were chosen: 5%, 15%, and 25%. With each exploration rate, ten trials were run and the average cumulative regrets were calculated. The results are shown in FIG. 5B. With large exploration rate, the exemplary algorithm learned the optimal policy quickly, but the regrets grew faster afterwards due to the exploration cost. On the contrary, when the exploration rate is small, the algorithm used more samples to learn the optimal policy, but the regrets grew with a lower rate once the optimal policy was discovered.

Figure 7:
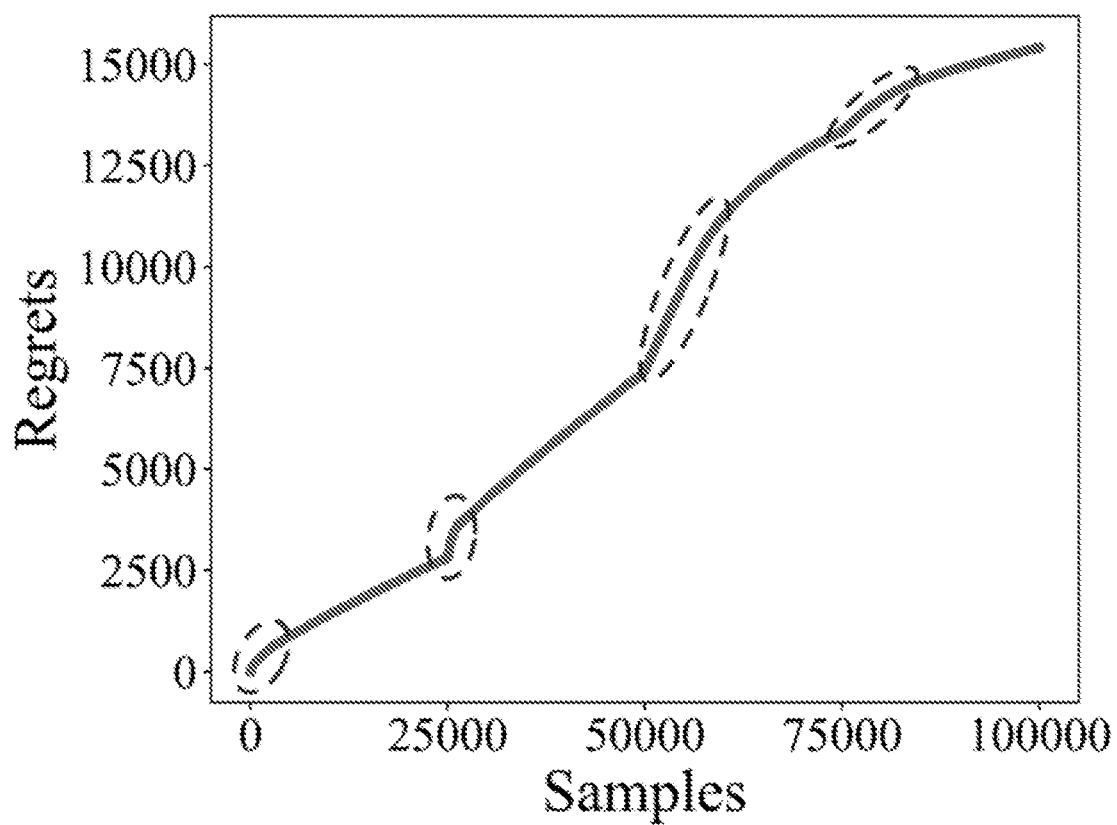
FIG. 7 provides cumulative regrets of an MAB-based control algorithm in the time-variant simulation test, in accordance with an embodiment of the disclosure. The test setting is the same as in FIGS. 6A-D. The result shown in FIG. 7 is averaged over ten trials. The dashed circles show the segments corresponding to the policy re-adjustment after each VSWR change.
Figure 8A:
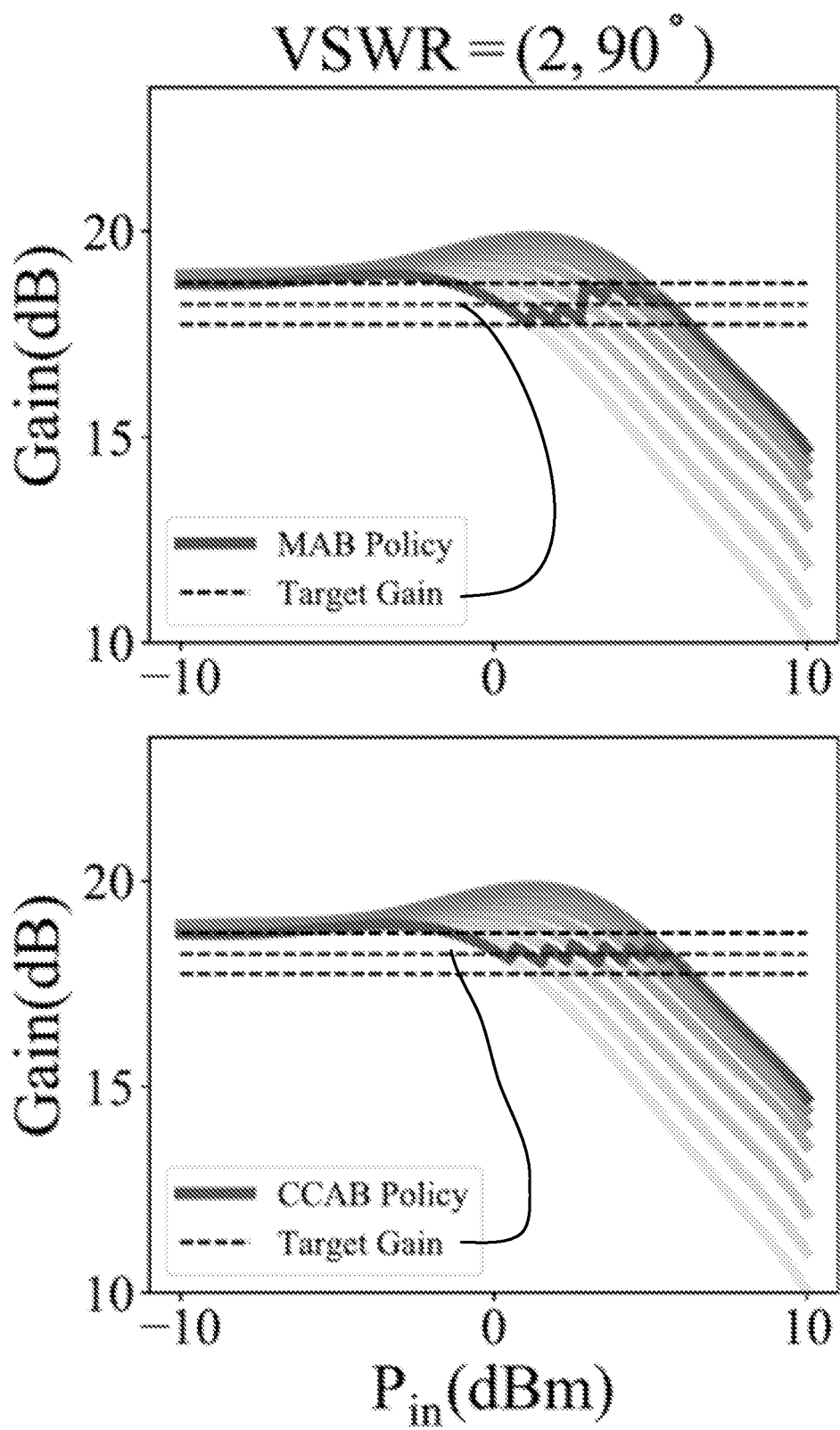
FIG. 8 provides a performance comparison between a CCAB-based control and a MAB-based control in a simulated time-variant environment, in accordance with an embodiment of the disclosure. The angle of the reflection coefficient is rotated in the order of 90, 180, 270, and 360 degrees. 5,000 samples are sent to the system after each rotation. The learned policies after every 5,000 samples are plotted in FIGS. 8A-D, with the one learned by the MAB-based algorithm on the top and the one learned by the CCAB-based algorithm at the bottom.
Figure 8B:
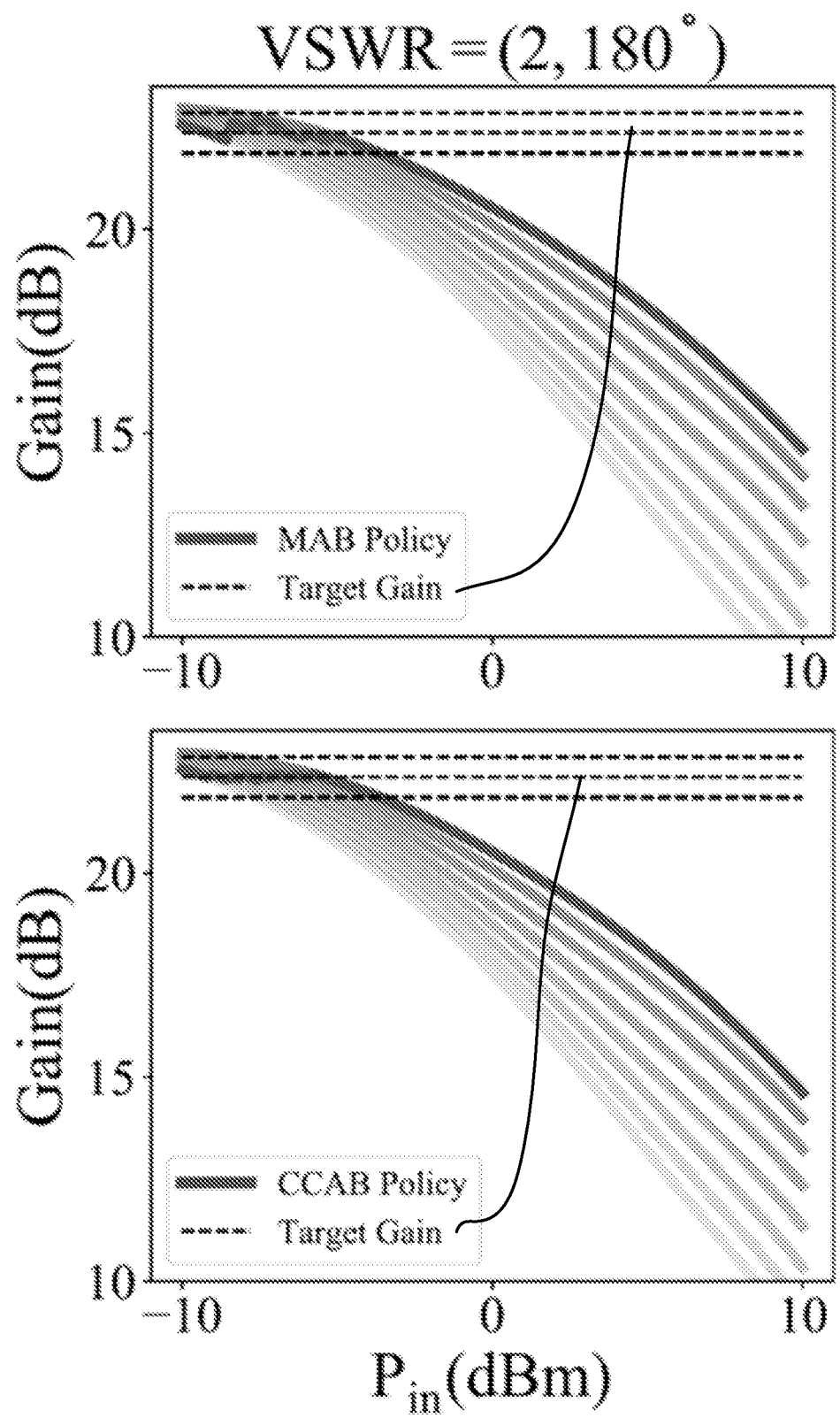
Figure 8C:
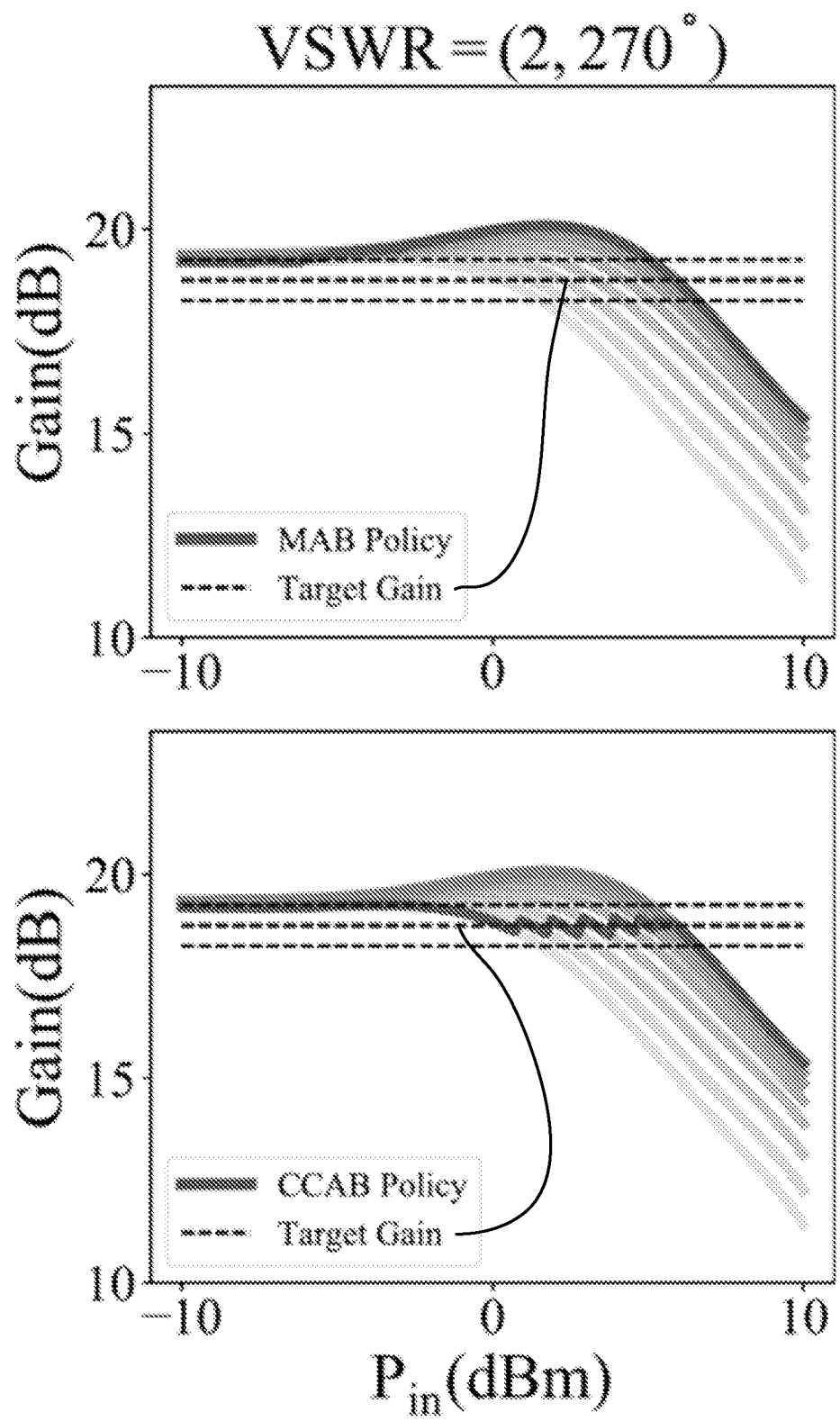
Figure 8D:
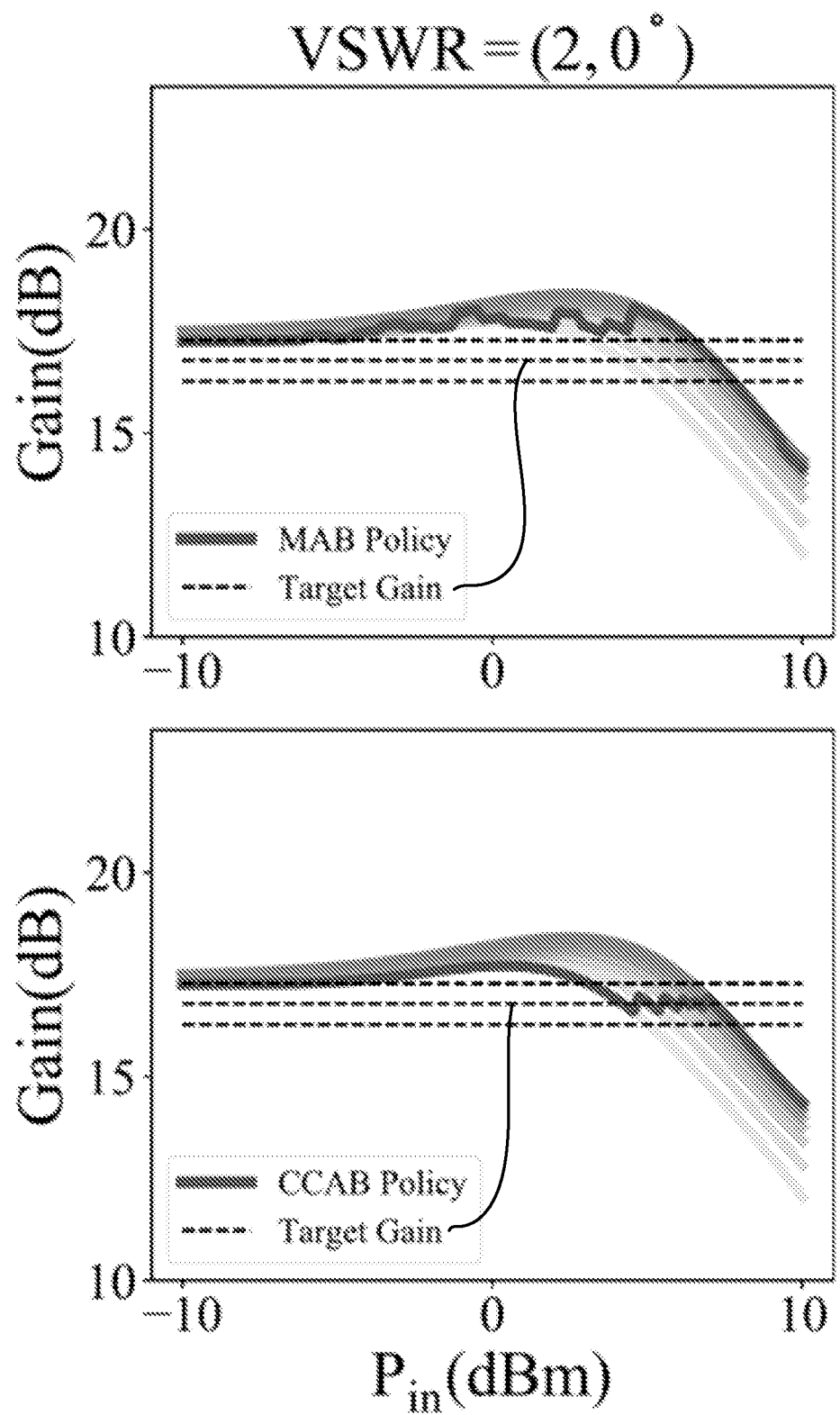

The algorithm was then tested in a simulated time-variant environment. In the initialization stage, the VSWR was set to have magnitude two and reflection coefficient angle 0 degrees. The PA was operating in a stable condition with a policy learned by the MAB-based algorithm. The VSWR magnitude was kept as two and rotate the reflection coefficient angle from 0 to 360 degree with 90 degree incremental steps. After each increment, 25,000 samples were sent to the PA. Essentially, the control algorithm had 25,000 samples to learn the new optimal policy and to adjust to the new environment. The algorithm's parameters were the same as in the time-invariant setting with 10% exploration rate. The results after each 25,000 samples are shown in FIG. 6. The MAB-based control effectively updated the policy to adapt to the simulated environmental changes. The cumulative regrets of the whole simulation, averaged over ten trials, are shown in FIG. 7. The sudden slope increments right after every 25,000 samples, marked by the dashed circles, correspond to the policy re-adjustment after VSWR changes. The regrets significantly increase as the old policy is no longer optimal. Later in each segment, the slope of the regrets decreases and converges to a constant level, indicating the new optimal policy has been learned by the exemplary control algorithm.

Control Algorithm Based on Contextual Continuum-Armed Bandit

While the MAB-based control algorithm is effective with low computational complexity, in some embodiments, the learning efficiency can be improved by leveraging more hardware properties. First, the exemplary MAB-based control algorithm treats the Aux PA turn-on settings as actions with independent rewards. The reward estimation of a specific action may not be updated until the action itself is applied. However, for hardware control problems, the hardware's performance under each setting can be often correlated. FIG. 4 shows that, in each learning region, the gain can monotonically increase as the 3-bit Aux PA turn-on setting goes from 0 to 7. This ordering structure can allow the gain of some turn-on settings to be inferred based on their observed neighborhoods before sampling the actions themselves. For example, if settings 3 and 6 have been explored in region $\mathcal{Z}^m$ which has expected gain $G^m$ (a=3) and Gm (a=6) respectively, we can infer that $G^m$ (a=4) and $G^m$ (a=5) shall fall between these two values. With the prior knowledge about this ordering structure, more information can be extracted from each observed sample and the learning efficiency can be improved. Second, the exemplary MAB-based algorithm can essentially approximates the power gain under each Aux PA turn-on setting by a constant within each learning region $\mathcal{Z}^m$ and one optimal action can be chosen for the region. The entire gain curves can, therefore, be coarsely approximated by piecewise constant functions. A better approximation scheme that enables action adjustments within each learning region can potentially improve the learned policy.

Approximate the Reward Function: To both leverage the correlated Aux PA turn-on settings and allow action fine-tuning within each learning region, a function approximation $\hat{G}^m$ for the power gain can be proposed in each learning region $\mathcal{Z}^m$:

$$\hat{G}^m(s,a)=k_3^m sa+k_2^m s+k_1^m a+k_0^m, \quad \text{Equation 9:}$$

where $s \in \mathcal{Z}^m$ is the input power, a is the Aux PA turn-on setting, and $k^m=[k_3^m, k_2^m, k_1^m, k_0^m]$ is the parameter to be estimated. Under a given input power $s_0$, the ordering relationship among the Aux PA turn-on settings can be captured by a linear model: $\hat{G}(s, a=a_0)=(k_3^m s_0+k_1^m)a+k_2^m s_0+k_0^m$. Under each Aux PA turn-on setting, the gain can also approximated by a linear function $\hat{G}(s, a=a_0)=(k_3^m a_0+k_2^m)s+k_1^m a_0+k_0^m$. With this approximated bilinear gain function, the estimated reward function now measures the difference between the approximated gain and the target gain $\hat{g}$:

$$\hat{R}_{CCAB}^m(s, a) = -|\hat{G}^m(s, a) - \hat{g}| \quad \text{Equation 10}$$
$$-|k_3^m sa + k_2^m s + k_1^m a + k_0^m - \hat{g}|.$$

Function approximation to exploit the correlations among actions can be used when the number of actions is large or when the action is modeled as a continuous variable, a setting known as the continuum-armed bandit. In addition, the new reward function can be assumed to depend on an observable state: input power s. The information contained in the observable state can help the control unit make better decisions. The control unit can seek to learn a policy mapping from the observable states to the actions that generates the largest rewards. By including the states into the reward function approximation, the Aux PA control can be formulated as a contextual bandit. Hence, the subscription CCAB in Equation 10 stands for contextual continuum-armed bandit.

Update the Reward Approximation Parameters: The learning procedure of the exemplary CCAB-based algorithm can also follow the exploration-exploitation scheme as in the MAB-based algorithm. With the proposed bilinear reward function approximation, the step of calculating the best action with respect to the current estimation can have a closed-form solution:

Equation 11

$$a^* = \left\lfloor \underset{a \in [a_{min}, a_{max}]}{\operatorname{argmax}} \hat{R}_{CCAB}^m(s = s_i, a) \right\rfloor =$$

$$\begin{cases} \min\left(\max\left(\left\lceil \frac{\hat{g} - k_2^m s_i - k_0^m}{k_3^m s_i + k_1^m} \right\rceil, a_{min}\right), a_{max}\right) \\ \quad \text{if } k_3^m s_i + k_1^m \neq 0 \\ a_{min} \\ \quad \text{if } k_3^m s_i + k_1^m = 0 \end{cases}.$$

The maximizer of $\hat{R}_{CCAB}^m(s_i, a)$ can be rounded to the nearest valid Aux PA turn-on setting bounded by $a_{min}$ and $a_{max}$. During the PA's operation, data entries can be collected in the form of triple tuples containing the input power, the Aux PA turn-on setting, and the corresponding power gain measured at the end of the feedback control loop: $d_i=(s_i,$ $a_i$, $g_i$). Given a set of N data entries in a learning region $\mathscr{Z}^m$, the approximation parameter can be updated to minimize the Euclidean distance between the approximated rewards and the true rewards:

$$\min_k \sum_{i=1}^{N} (r_i - \hat{R}_{CCAB}^m(s_i, a_i))^2 \quad \text{Equation 12}$$

$$= \min_k \sum_{i=1}^{N} (|\hat{G}^m(s_i, a_i) - \hat{g}| - |g_i - \hat{g}|)^2 \quad \text{Equation 13}$$

$$\leq \min_k \sum_{i=1}^{N} (\hat{G}^m(s_i, a_i) - g_i)^2. \quad \text{Equation 14}$$

The non-linear least square problem in Equation 13 is upper bounded by the linear least square problem in Equation 14) which is much easier to solve. Therefore, the approximation update step can be given by:

$$k^m \leftarrow \underset{k}{\operatorname{argmin}} \sum_{d_i \in B^m} (g_i - k_3 s_i a_i - k_2 s_i - k_1 a_i - k_0)^2, \quad \text{Equation 15}$$

where $B^m$ is a first-in-first-out (FIFO) buffer to hold L most recent observed data within the learning region. The FIFO buffer can allow the algorithm to adapt to the time-variant environment and the buffer length L determines the rate of adaption. Formulating the function parameter update as solving least square problems would be understood by a POSA on both the continuum-armed bandit and the contextual bandit.

In some embodiments, the above regression step can include a Tikhonov regularizer to increase the stability, and recursive least square (RLS) update can be used to improve the computational efficiency. Compared to the exemplary MAB-based algorithm discussed above, the CCAB-base algorithm can have additional cost in both computation and memory. The computational complexity can be mainly increased by the least square step. The RLS update with one addition sample can avoid matrix inversion but still can have complexity $\mathcal{O}(N_k^2)$, where $N_k=4$ can be the number of parameters to be estimated. The memory requirement can be mainly increased by the implementation of FIFO buffers whose cost is $\mathcal{O}(L)$. The least square problem in Equation 14 can also be solved using iterative methods such as stochastic gradient descent (SGD). Although SGD can reduce both the computational and memory requirements at each step, it can use more steps to reach a satisfactory result. Therefore, extracting more information from each sample can come with the cost of additional computation and memory requirements. This tradeoff can be considered when designing PA systems for different applications, in accordance with some embodiments of the present disclosure. The exemplary CCAB-based linear gain control is summarized in Algorithm 2.

---

Algorithm 2 Linear Gain Control Algorithm Based on
Contextual Continuum-Armed Bandit Divided the high input power region into M learning
  regions $\mathscr{Z}^1, \mathscr{Z}^2, \ldots, \mathscr{Z}^M$.
Define the reward approximation function in each region
  as: $R_{CCAB}^m(s, a) = -|k_3^m sa + k_2^m s + k_1^m a + k_0^m - \hat{g}|$.
In each region, initialize the reward model's parameters $k^m$.

---

Algorithm 2 Linear Gain Control Algorithm Based on
Contextual Continuum-Armed Bandit Set up on FIFO buffer $B^m$ of length L in each learning
  region.
Obtain the target gain value $\hat{g}$.
For each time t:
  Observe an input with power $s_t$ that falls into one of the
    regions $\mathscr{Z}_t = \mathscr{Z}^m$.
  Calculate the best action based on the reward
    approximation function:

$$a^* = \left[\underset{a \in [a_{min}, a_{max}]}{\operatorname{argmax}} R_{CCAB}^m(s_t, a)\right].$$

With probability $1 - \epsilon$:
    $a_t = a^*$.
  Otherwise:
    Randomly choose an action $a_t \neq a^*$.
  Apply action $a_t$ and observe gain $g_t$.
  Add $d_t = (s_t, a_t, g_t)$ into FIFO buffer $B^m$.
  Remove the earliest data in $B^m$ if the length of $B^m$ is
    larger than L.
  Update model parameters using regression:

$$k^m \leftarrow \underset{k}{\operatorname{argmin}} \sum_{d_i \in B^m} (g_i - k_3 s_i a_i - k_2 s_i - k_1 a_i - k_0)^2.$$

---

Testing and Results: To demonstrate the improved learning efficiency of the exemplary CCAB-based control algorithm, its performance was compared with the exemplary MAB-based algorithm's (discussed above) in a simulated time-variant environment. The simulation settings were similar to those used for the exemplary MAB-based algorithm described above. Several changes were introduced in this test. The length of each FIFO buffer Bin was set to be 50. The number of samples after each VSWR change was set to 5,000, which is significantly lower than the number of samples used in the exemplary MAB-based algorithm's test. This reduction was introduced to show the improved learning efficiency of the exemplary CCAB-based algorithm. The same set of samples can used for the two exemplary algorithms during each trial.

Figure 9:
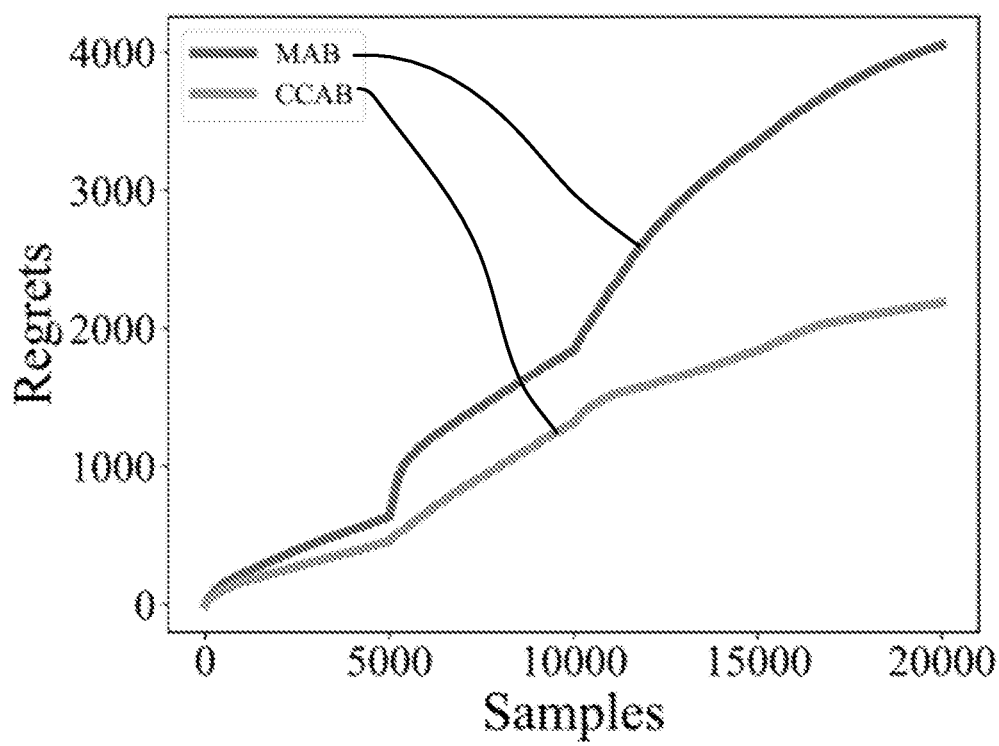
FIG. 9 provides cumulative regrets of a CCAB-based control algorithm in the time-variant simulation test, in accordance with an embodiment of the disclosure. The test settings are the same as in FIGS. 8A-D. The regrets of the MAB-based control algorithm are also plotted as a comparison.

The results after each 5,000 samples are shown in FIG. 8. The upper row shows the policies learned by the exemplary MAB-based algorithm. As the number of samples was largely reduced after each VSWR change, the exemplary MAB-based algorithm failed to adjust to the new optimal policy due to insufficient exploration of various actions in different learning regions. The lower row in FIG. 8 shows the policy learned by the exemplary CCAB-based algorithm. The reward approximation function significantly improved the algorithm's learning efficiency, and the new optimal policies were successfully learned at the end of each 5000 samples. The improved learning efficiency was also evident in the cumulative regrets plot in FIG. 9. The cumulative regrets as shown were averaged over ten trials. The regrets of the exemplary CCAB-based algorithm grew with a much lower rate and the total regrets at the end of the simulation test was only about ½ of the exemplary MAB-based algorithm's.

Control Algorithm Based on the Actor-Critic Framework

The exemplary CCAB-based control algorithm can apply function approximation to the rewards within each learning region and can exploit the correlation among actions. However, there may be no relationship assumed cross different learning regions, and the learning processes of each region can be independent. As suggested in FIG. 3A, the gain curve under each Aux PA control turn-on setting can be smooth and can have a clear ordering structure. The desired policy can gradually increase the Aux PA setting as the input power goes up. In other words, if the input power of region $\mathcal{Z}^{mid}$ is between the input power of region and $\mathcal{Z}^{low}$ and $\mathcal{Z}^{high}$, then the selected action a of each region can also satisfy $a^{low} \leq a^{mid} \leq a^{high}$. Therefore, the optimal action of a learning region can be inferred before exploring its actions as long as its neighborhoods are well explored. In this way, the learning efficiency can be further improved.

Policy Function: To exploit the relationship among the learning regions, a parametric policy function can be constructed which maps from states (input power) to actions (Aux PA turn-on settings). For an exemplary system, a piecewise linear function can be shown to provide good approximation of the state-action relationship:

$$\Pi_{c_0,c_1}(s) = \max(\min(c_1 s + c_0, a_{max}), a_{min}). \quad \text{Equation 16:}$$

Figure 10:
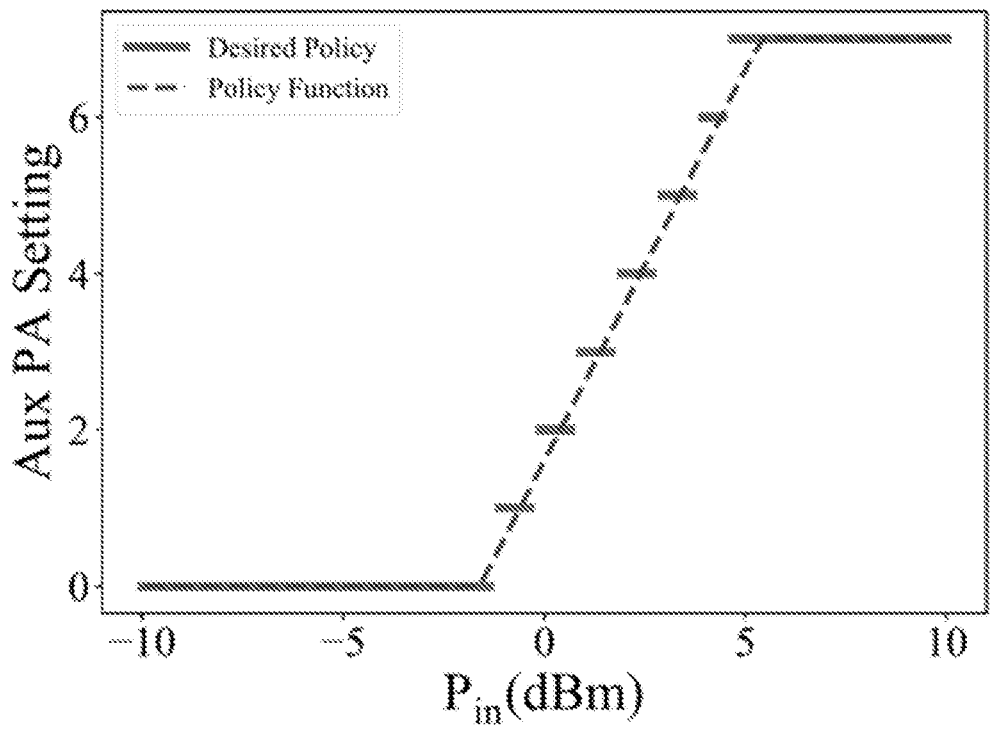
FIG. 10 provides a plot of a policy function, in accordance with an embodiment of the disclosure. The horizontal solid lines correspond to the policy in FIG. 3. The dashed line shows the approximation of this policy using the piecewise linear policy function defined in Equation 16.
Figure 11A:
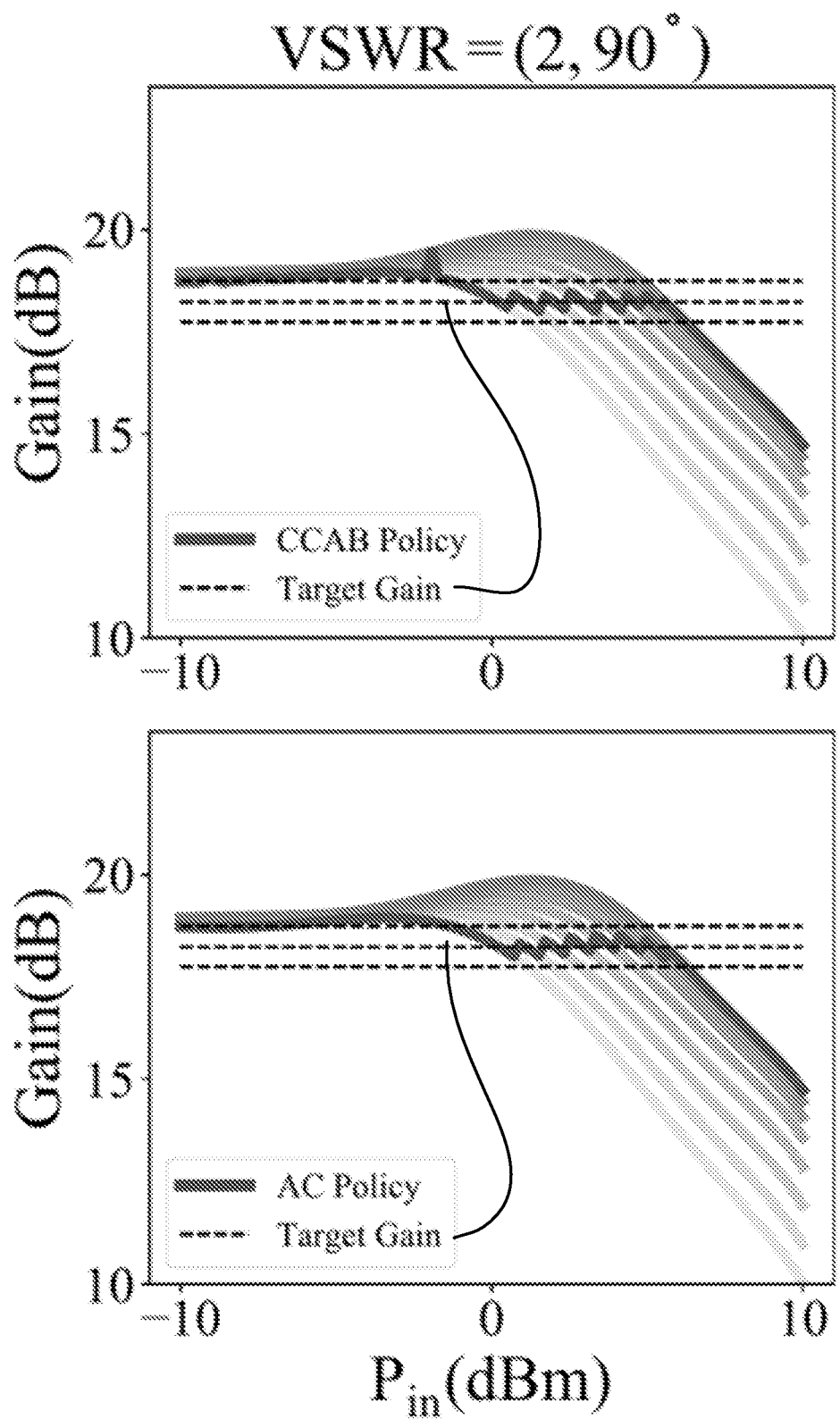
FIG. 11 provides simulation results of an AC-based control algorithm in a time-variant environment, in accordance with an embodiment of the disclosure. The angle of the reflection coefficient is rotated in the order of 90, 180, 270, and 360 degrees. 1,500 samples are sent to the system after each rotation. The learned policies after every 1,500 samples are plotted in FIGs. A-D, with the one learned by a CCAB-based algorithm on the top and the one learned by the AC-based algorithm at the bottom.
Figure 11B:
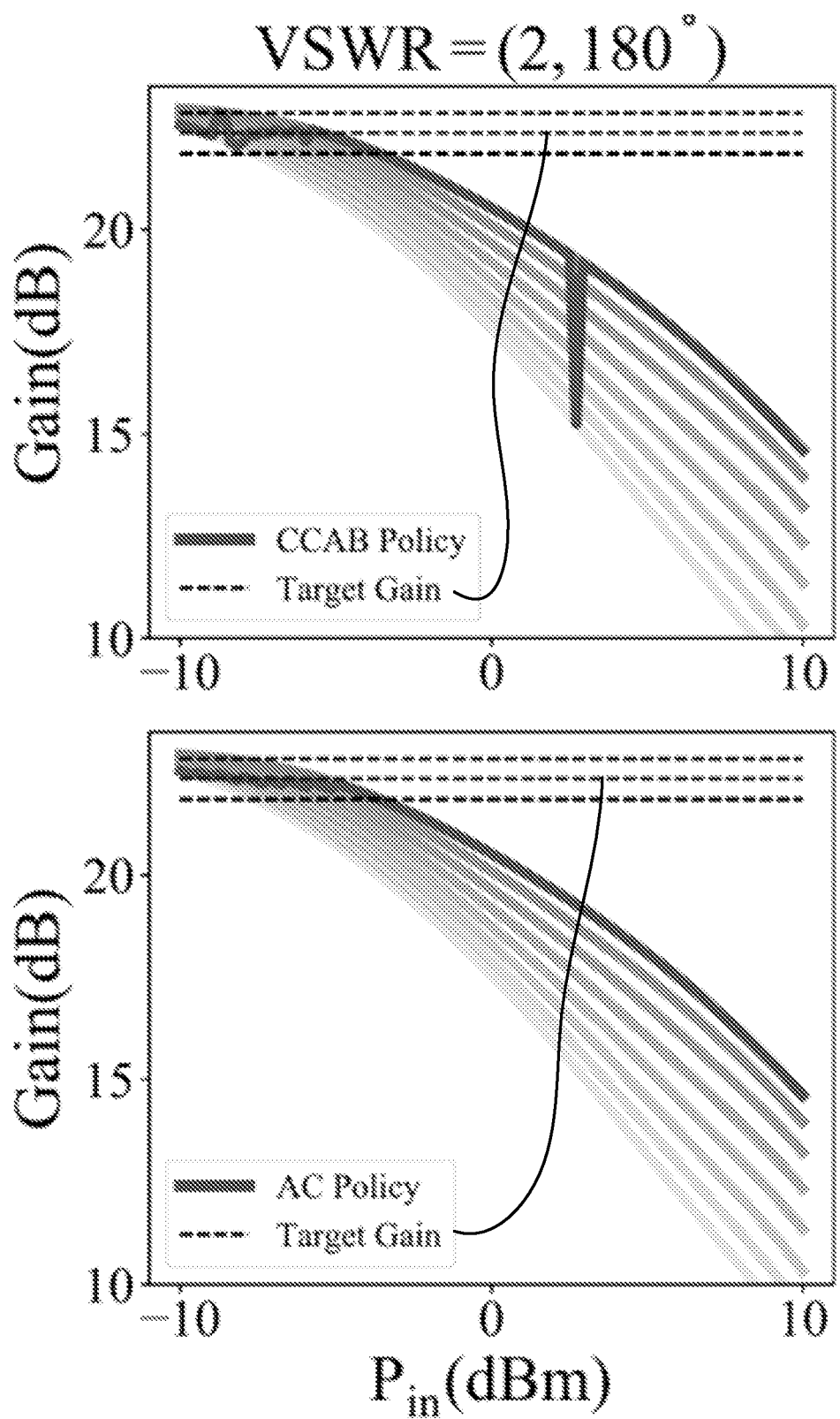
Figure 11C:
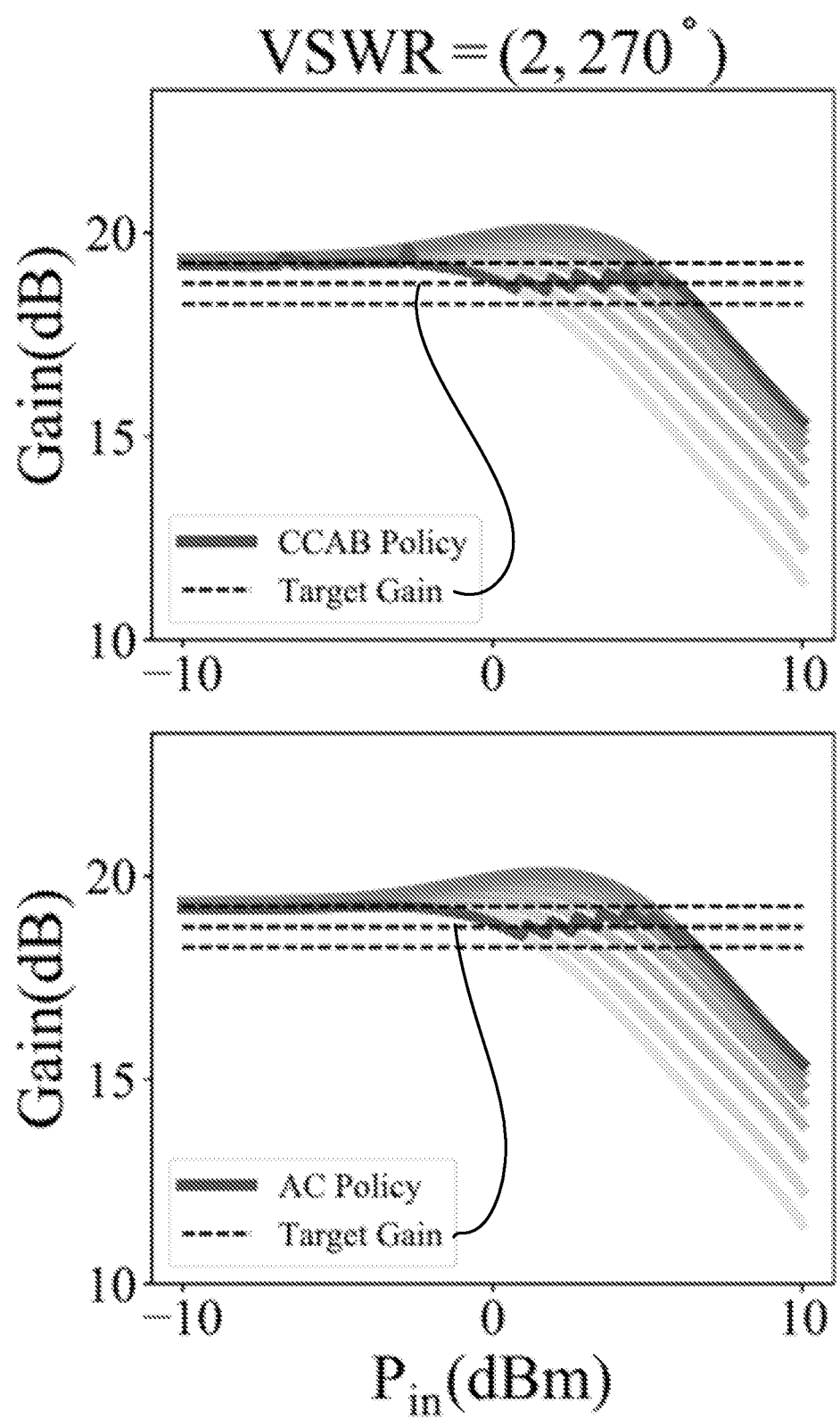
Figure 11D:
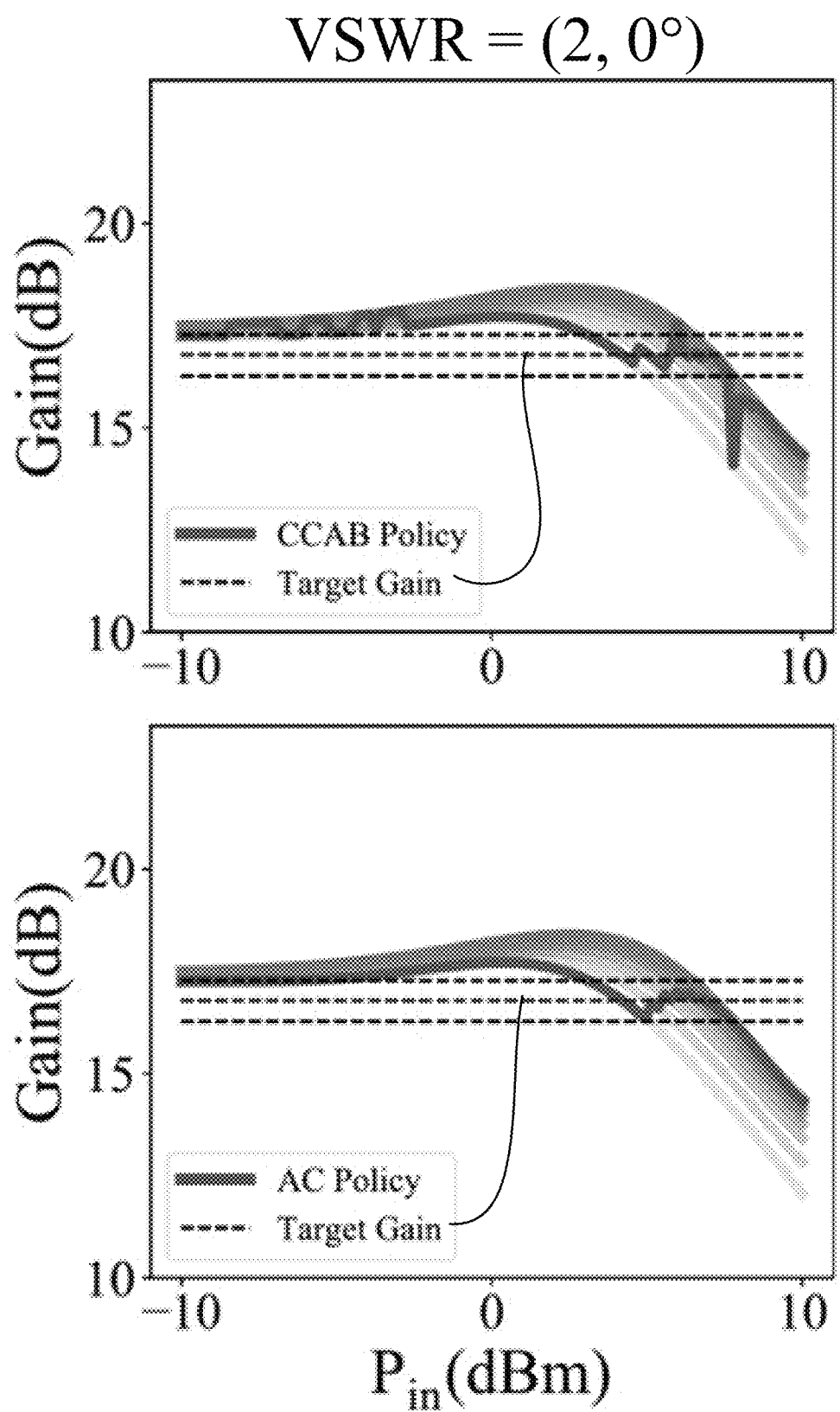

The output of the function can be continuous which will can rounded to the nearest integer as a valid Aux PA turn-on setting: $a^* = \lfloor \Pi_c(s) \rceil$. This policy function can have two parameters: $c_0$ and $c_1$, where $c_1$ controls how fast the selected Aux PA turn-on setting increases with the input power, and $c_0$ controls the positions of the turning points of upper and lower flat regions. One example of the policy function is plotted in FIG. 10. The horizontal lines in the plot correspond to the policy shown earlier in FIG. 3. This policy can be approximated by the piecewise linear policy function shown as the dashed diagonal line.

Policy Gradient: With the policy function defined in Equation 16, learning the optimal policy can be the equivalent of searching for the policy parameter $c = [c_0, c_1]$ that leads to the highest expected reward. By combining the policy function with the reward function approximation in Equation 10, the following equation can be written as the approximated expected reward of a policy parameterized by c:

$$\hat{R}_{AC}(c) = E\left[\sum_{m=1}^{M} 1_{\mathcal{Z}^m}(s)\hat{R}_{AC}^m(s,c)\right] \quad \text{Equation 17}$$

$$= -E\left[\sum_{m=1}^{M} 1_{\mathcal{Z}^m}(s)|k_3^m s\Pi_c(s) + k_2^m s + k_1^m \Pi_c(s) + k_0^m - \hat{g}|\right].$$

where $1_{\mathcal{Z}}(s)$ is the indicator function that shows which learning region the input power s falls into, and the expectation is taken over the input power which can be assumed to follow some distribution. This expected reward can be controlled by two sets of parameters: the bilinear reward function parameter k and the policy parameter c. Given the current estimation of the reward function, the reward can be maximized by applying gradient ascent on c. The gradient of the expected reward Equation 17 with respect to the policy parameters can be calculated as:

$$\sigma^m = \text{sgn}(k_3^m s\Pi_c(s) + k_2^m s + k_1^m \Pi_c(s) + k_0^m - \hat{g}) \quad \text{Equation 18}$$

$$\frac{\partial \hat{R}_{AC}^m(s,c)}{\partial c_0} = \begin{cases} -\sigma^m(k_3^m s + k_1^m) & a_{min} \leq c_1 s + c_0 \leq a_{max} \\ 0 & \text{elsewhere} \end{cases} \quad \text{Equation 19}$$

$$\frac{\partial \hat{R}_{AC}^m(s,c)}{\partial c_1} = \begin{cases} -\sigma_s^m(k_3^m s + k_1^m) & a_{min} \leq c_1 s + c_0 \leq a_{max} \\ 0 & \text{elsewhere} \end{cases} \quad \text{Equation 20}$$

$$\frac{\partial \hat{R}_{AC}(c)}{\partial c_0} = E\left[\sum_{m=1}^{M} 1_{\mathcal{Z}^m}(s)\frac{\partial \hat{R}_{AC}^m(s,c)}{\partial c_0}\right] \quad \text{Equation 21}$$

-continued $$\frac{\partial \hat{R}_{AC}(c)}{\partial c_1} = E\left[\sum_{m=1}^{M} 1_{\mathcal{Z}^m}(s)\frac{\partial \hat{R}_{AC}^m(s,c)}{\partial c_1}\right]. \quad \text{Equation 22}$$

Evaluating the exact gradients in Equations 21 and 22 can be inapplicable when the PA is under operation. Hence, the stochastic gradient (SG) ascent algorithm can be applied with the gradient estimation given by Equation 19 and Equation 20. Specifically, at each time step t with the input power $s_t$ falling into the learning region $\mathcal{Z}$, the policy parameter can be updated:

$$c \leftarrow c + \beta \frac{\partial \hat{R}_{AC}^m(s_t, c)}{\partial c}, \quad \text{Equation 23}$$

where β is the SG step size. In some embodiments, running the vanilla SG algorithm on the policy function defined in Equation 16 may encounter the gradient diminishing problem in the two flat regions of the policy function. This problem can be solved by specifying a polygonal feasible region for c and projecting the updated c onto this feasible region after each SG update, a method known as the projected gradient ascent. Updating policy based on forming gradients with respect to the policy parameters is known as the policy gradient method to those skilled in the art.

As the policy parameters are updated based on the estimated reward function, it can be desirable for the reward function to closely approximate the true rewards. The update for the reward function parameter k can stay the same as described above: One FIFO buffer $B^m$ is constructed for each learning region to store observed input power, Aux PA turn-on setting, and the corresponding power gain. $k^m$ can be updated by running regression on all the data points in $B^m$.

Actor-Critic: In this exemplary algorithm, there are two parameterized function approximations, one for the policy and one for the reward. This approach is known as the actor critic (AC) framework to those skilled in the art. The actor, which is the policy function, selects actions based on the policy parameters c. The critic, which is the reward function, seeks to closely approximate the rewards generated by these actions. Based on the estimated reward function, critic provides feedback to the actor on how to improve the actions in order to increase rewards. In some embodiments, the feedback can be in the form of policy gradient. During the whole learning process, the critic and the actor can be updated alternatively to improve the reward approximation and the policy function respectively. The bilinear reward function approximation in each learning region can be viewed as an individual critic. Cross all learning regions, these critics can work together to improve the policy function. Here, the complex-shaped overall rewards can be approximated by multiple simple bilinear models. The policy function can also be viewed as a regularizer on all the local critics, which improves the consistency of the overall policy. Similar to the other exemplary control algorithms discussed above, the AC-based algorithm can follow the exploration-exploitation scheme. At each time t, the reward function (critic) parameter k can be updated. The policy function (actor) parameter c, on the other hand, may only be updated when exploitation is activated. The AC-based algorithm converges in time-invariant environments. Notice that the update of the reward function parameter k does not depend on the policy parameter c. As t→∞ and L→∞, k converges because of the linear regression update. As k converges, c converges under the standard SG convergence conditions.

Experience Replay: The actor update step can perform SG ascent on the policy function. Although the computational cost of the update can be low, a large number of SG steps may be used for the policy function to improve. When there is only one SG step within each learning step, it can take a long time to learn the optimal policy. One way to improve the learning rate is to perform more SG updates within some of the learning steps. For example, one step policy update can be performed for the majority of the time. Then every $T_e$ time period, the policy function can be updated to be the optimal with respect to the current reward function estimation. Since the previous input power can be already stored in the FIFO buffers, these stored values can be used to approximate the expected reward:

$$\hat{R}_{ER}(c) = \frac{1}{N_B} \sum_{m=1}^{M} \sum_{s_i \in B^m} |k_3^m s_i \Pi_c(s_i) + k_2^m s_i + k_1^m \Pi_c(s_i)| \quad \text{Equation 24}$$

where $N_B$ is the total number of samples stored in the buffers. The policy parameter can be updated to the maximizer of this approximated expected reward:

$$c_{ER} = \operatorname*{argmin}_{c} \hat{R}_{ER}(c). \quad \text{Equation 25}$$

The optimization problem can be solved by running the projected gradient ascent algorithm. This update step can re-uses the historical data stored in the buffer, which can be known as "experience replay" (ER) to those skilled in the art.

An alternative way to perform ER is to enforce the policy function to match the best actions suggested by the current reward function estimation. Given reward function parameters k, the optimal action under state s is given by Equation 11. Therefore, the optimal action corresponding to each input power stored in the buffer is first calculated, and then the policy function on these actions can be regressed:

$$c_{ER} = \operatorname*{argmin}_{c} \sum_{m=1}^{M} \sum_{s_i \in B^m} \left( \operatorname*{argmax}_{a} R_{CCAB}^m(s_i, a) - \Pi_c(s_i) \right)^2. \quad \text{Equation 26}$$

This optimization problem can also be solved using a projected gradient descent algorithm. In some embodiments, it can be observed that the two ER methods have similar performance. When the number of samples in the buffers is large, a minibatch can be randomly sampled to evaluate the gradient at each SG step. The policy function parameter c before the ER update can be used as the starting point of the optimization problem. As the critic update is essentially the same as in the exemplary CAAB-based algorithm discussed above, the main contributor to the additional computational complexity can be the ER step which contains internal iterations. An exemplary AC-based algorithm with experience replay is summarized in Algorithm 3.

---

Algorithm 3 Linear Gain Control Algorithm Based on the Actor-Critic Framework With Experience Replay

---

Set up ACTOR
  Initialize the parameters $c_0$, $c_1$ of the policy function:
    $\Pi_c(s) = \max(\min(c_1 s + c_0, a_{max}), a_{min})$.
  Set stochastic gradient ascent step size $\beta$.
Set up CRITIC
  Divided the high input power region into M learning regions $\mathscr{Z}^1, \mathscr{Z}^2, \ldots, \mathscr{Z}^M$.
  Define the reward function in each learning regions as:
    $\hat{R}_{AC}^m(s, c) = -|k_3^m s \Pi_c(s) + k_2^m s + k_1^m \Pi_c(s) + k_0^m - \hat{g}|$.
  In each region, initialize the reward model's parameters $k^m$.
  Set up one FIFO buffer of length L in each learning region.
  Obtain the target gain value $\hat{g}$.
Set experience replay interval time $T_e$.
For each time t:
  Observe an input with power $s_t$ that falls into one of the regions $\mathscr{Z}_t = \mathscr{Z}^m$.
  Calculate the action suggested by the ACTOR:
    $a^* = [\Pi_c(s_t)]$.
  With probability $1 - \varepsilon$:
    $a_t = a^*$.
  With probability $\varepsilon$:
    Randomly choose an action $a_t \neq a^*$.
  Apply action $a_t$ and observe gain $g_t$.
  Update CRITIC:
    Add $d_t = (s_t, a_t, g_t)$ into FIFO buffer $B^m$.
    Remove the earliest data in $B^m$ the length of $B^m$ is larger than L.
    Update model parameters using regression:

$$k^m \leftarrow \operatorname*{argmin}_{k} \sum_{d_i \in B^m} (g_i - k_3 s_i a_i - k_2 s_i - k_1 a_i - k_0)^2.$$

Update ACTOR if $a_t == a^*$:

$$c \leftarrow c + \beta \frac{\partial \hat{R}_{AC}^m(s_t, c)}{\partial c}$$

Perform experience replay if $t \% T_e == 0$:

$$c \leftarrow \operatorname*{argmin}_{c} \sum_{m=1}^{M} \sum_{s_i \in B^m} \left| k_3^m s_i \prod_c (s_i) + k_2^m s_i + k_1^m \prod_c (s_i) k_0^m + \hat{g} \right| \text{ or}$$

$$c \leftarrow \operatorname*{argmin}_{c} \sum_{m=1}^{M} \sum_{s_i \in B^m} \left( \operatorname*{argmax}_{a} R_{CCAB}^m(s_i, a) - \prod_c (s_i) \right)^2$$

---

Testing and Results: The further improved learning efficiency of the exemplary AC-based control algorithm can be shown by comparing its performance with the exemplary CCAB-based algorithm's (discussed above) in a simulated time-variant environment. The simulation settings were similar to the ones in the two aforementioned tests. The length of each FIFO buffer Bm was set to be 50 for both algorithms. To show the improvement in the learning efficiency distinctly, the number of samples after each VSWR change was further reduced to 1,500. The same set of samples were used for the two algorithms during each trial. The exploration rate was reduced from 10% as in the previous tests to 5%. The step size for the actor update was set to be 0.05 and the experience replay was performed every 10 steps.

Figure 12:
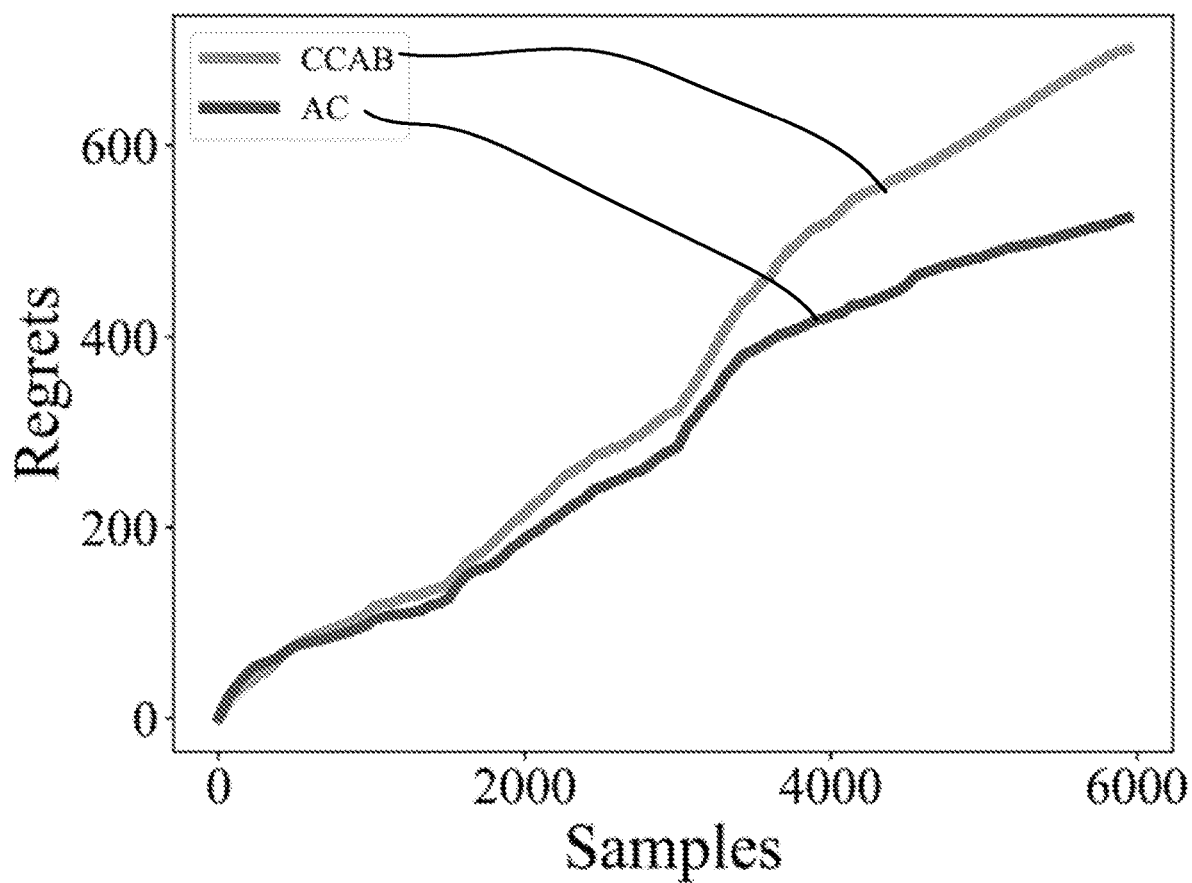
FIG. 12 provides cumulative regrets of an AC-based control algorithm in time-variant simulation test, in accordance with an embodiment of the disclosure. The test setup is the same as the one in FIG. 11. The result shown is averaged over ten trials. The regrets of a CCAB-based control algorithm is also plotted as a comparison.

The results after each 1,500 samples are shown in FIG. 11. The upper row shows the policies learned by the exemplary CCAB-based algorithm (discussed above). As the number of samples after each VSWR change was further reduced, the exemplary CCAB-based algorithm struggled to adjust to the new optimal policy. Although the optimal actions were learned in the well-explored learning regions, the inferior action choices in the other regions led to an inconsistent policy overall. The lower row in FIG. 11 shows the policy learned by the exemplary AC-based algorithm. The piecewise linear policy function acted as a regularizer and significantly improved the consistency of the policy. The new optimal policies were successfully learned by the end of each 1,500 samples. Therefore, by imposing a policy function that leverages the correlation among learning regions, the exemplary AC-based control improves the learning efficiency. FIG. 12 quantifies this improvement on the cumulative regrets plot which averages the results over ten trials. As the simulation test progressed, the regrets of the exemplary AC-based algorithm grew with a lower rate.

System-Level Implementation

Figure 13:
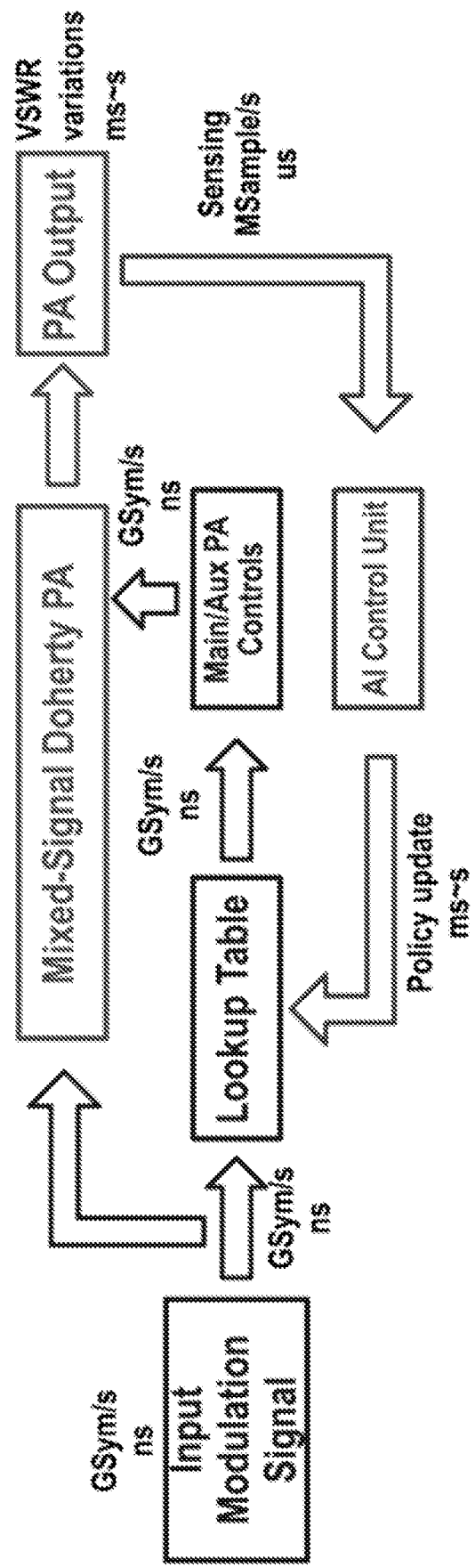
FIG. 13 provides a system level block diagram with time scales, in accordance with an embodiment of the disclosure.

Various embodiments of the present disclosure can make use of the control algorithms discussed above. As shown in FIG. 13, the main and auxiliary PA control signals can be generated based on a modulated signal and a lookup table, which can be stored in memory of the PA system. The lookup table can be real-time adjusted/updated in an iterative process by an AI core control unit to accommodate environmental changes such as the load mismatch. Since the information for transmission is known a priori, the baseband can readily generate the real-time modulated signals and control signals for the main and auxiliary PAs based on the lookup table. The time scale for modulation can be ns for GHz modulation signals and thus the auxiliary PA control signals can be at GHz speed. The main PA settings can be adjusted to accommodate the load mismatch. The lookup table can be updated at the speed of load variations whose time scale can be from ms to s or even longer.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way.

What is claimed is:

1. A method of controlling a power amplifier (PA) comprising:
    determining a power back off gain and a lower bound gain for the PA; and
    performing an iterative auxiliary PA turn-on setting selection process comprising:
        determining an instantaneous power input to the PA;
        based on the instantaneous power input, choosing a turn-on setting from one or more turn-on settings of one or more auxiliary PA paths of the PA that causes an instantaneous gain of the PA to be between the power back off gain and the lower bound gain; and
        applying the chosen turn-on setting to one or more of the auxiliary PA paths;
    wherein memory for the PA stores a look-up table; and
    wherein the look-up table comprises a turn-on setting for one or more of the auxiliary PA paths to be chosen for potential power inputs to the PA.

2. The method of claim 1 further comprising selecting a target gain for the PA;
    wherein the chosen turn-on setting is the turn-on setting that minimizes the difference between the target gain and the instantaneous gain of the PA.

3. The method of claim 1, wherein the chosen turn-on setting is the turn-on setting associated with the potential power input in the look-up table that corresponds to the instantaneous power input.

4. The method of claim 1 further comprising iteratively updating the look-up table based on current operating conditions of the PA.

5. The method of claim 4, wherein iteratively updating the look-up table utilizes a multi-armed bandit optimization process.

6. A method of controlling a power amplifier (PA), the PA comprising a main PA path with one or more turn-on settings, an auxiliary PA path with one or more turn-on settings, and memory storing a look-up table comprising one or more turn-on settings for the auxiliary PA path to be chosen for one or more potential power inputs to the PA, the method comprising:
    performing an iterative auxiliary PA turn-on setting selection process comprising, based upon an instantaneous power input to the PA, choosing from the turn-on settings of the auxiliary PA path the one that causes an instantaneous gain of the PA to be between a power back off gain and a lower bound gain; and
    iteratively updating the look-up table based on current operating conditions of the PA;
    wherein iteratively updating the look-up table utilizes a contextual continuum-arm bandit optimization process.

7. The method of claim 6 further comprising:
    determining the power back off gain;
    determining the lower bound gain;
    determining the instantaneous power input; and
    applying the chosen turn-on setting to the auxiliary PA path;
    wherein the contextual continuum-arm bandit optimization process comprises:
        dividing the plurality of potential power inputs into a low power input region and a high power input region;
        dividing the high power input region into a plurality of learning regions;
        defining a reward approximation function for each of the plurality learning regions;
        in each of the plurality of regions, initializing reward model parameters for the reward approximation functions;
        obtaining the instantaneous power input corresponding to a region in the plurality of learning regions;
        selecting a turn-on setting in the plurality of turn-on settings for the instantaneous power input that maximizes the reward approximation function corresponding to the learning region for the instantaneous power input;

applying a turn-on setting to the auxiliary PA path that is one of the selected turn-on setting and a turn-on setting in the plurality of turn-on settings other than the selected turn-on setting;

observing an updated instantaneous gain of the PA; and updating the reward model parameters using a regression analysis.

8. A method of controlling a power amplifier (PA) comprising:

determining a power back off gain and a lower bound gain for the PA; and performing an iterative auxiliary PA turn-on setting selection process comprising:

determining an instantaneous power input to the PA;

based on the instantaneous power input, choosing a turn-on setting from one or more turn-on settings of one or more auxiliary PA paths of the PA that causes an instantaneous gain of the PA to be between the power back off gain and the lower bound gain; and applying the chosen turn-on setting to one or more of the auxiliary PA paths;

wherein memory for the PA stores a look-up table;

wherein the look-up table comprises one or more turn-on settings for one or more of the auxiliary PA paths to be chosen for potential power inputs to the PA;

wherein the method further comprises iteratively updating the look-up table based on current operating conditions of the PA; and wherein iteratively updating the look-up table comprises:

dividing the plurality of potential power input levels into a low power input region and a high power input region;

dividing the high power input region into a plurality of learning regions;

defining a reward approximation function for each of the plurality of learning regions;

defining a policy function across all of the plurality of learning regions;

in each of the plurality of regions, initializing reward model parameters for reward approximation functions;

obtaining the instantaneous power input corresponding to a region in the plurality of learning regions;

selecting a turn-on setting in the plurality of turn-on settings for the instantaneous power input based on a policy function;

applying a turn-on setting to the one or more auxiliary PA paths that is one of the selected turn-on setting and a turn-on setting in the plurality of turn-on settings other than the selected turn-on setting;

observing an updated instantaneous gain of the PA;

updating the reward model parameters using a regression analysis; and updating parameters for the policy function using a regression analysis.

9. The method of claim 1, wherein the PA is a mm-wave mixed-signal Doherty PA.

10. A power amplifier (PA) comprising:

an input network configured to receive a power input signal;

an output network configured to output a power output signal;

a main PA path;

an auxiliary PA path, the auxiliary PA path having a plurality of turn-on settings; and a PA controller configured to implement a PA control algorithm comprising:

determining a power back off gain and a lower bound gain for the PA; and performing an iterative auxiliary PA turn-on setting selection process comprising:

determining an instantaneous power level for the power input signal;

based on the instantaneous power level, choosing a turn-on setting in the plurality of turn-on settings of the auxiliary PA path that causes an instantaneous gain of the PA to be between the power back off gain and the lower bound gain; and applying the chosen turn-on setting to the auxiliary PA path.

11. The PA of claim 10, wherein the PA is a Doherty PA further comprising memory for storing a look-up table, wherein the look-up table comprises a turn-on setting for the auxiliary PA path to be chosen for a plurality of potential power input levels for the power input signal.

12. The PA of claim 11, wherein the PA control algorithm further comprises iteratively updating the look-up table based on current operating conditions of the Doherty PA utilizing a contextual continuum-arm bandit optimization process.

13. The PA of claim 12, wherein the contextual continuum-arm bandit optimization process, comprises:

dividing the plurality of potential power input levels into a low power input region and a high power input region;

dividing the high power input region into a plurality of learning regions;

defining a reward approximation function for each of the plurality learning regions;

in each of the plurality of regions, initializing reward model parameters for the reward approximation functions;

obtaining the instantaneous power input level corresponding to a region in the plurality of learning regions;

selecting a turn-on setting in the plurality of turn-on settings for the instantaneous power input level that maximizes the reward approximation function corresponding to the learning region for the instantaneous power input level;

applying a turn-on setting to the auxiliary PA path that is one of the selected turn-on setting and a turn-on setting in the plurality of turn-on settings other than the selected turn-on setting;

observing an updated instantaneous gain of the PA; and updating the reward model parameters using a regression analysis.

14. The PA of claim 11, wherein the PA control algorithm further comprises iteratively updating the look-up table based on current operating conditions of the Doherty PA; and wherein iteratively updating the look-up table comprises:

dividing the plurality of potential power input levels into a low power input region and a high power input region;

dividing the high power input region into a plurality of learning regions;

defining a reward approximation function for each of the plurality of learning regions;

defining a policy function across all of the plurality of learning regions;

in each of the plurality of regions, initializing reward model parameters for reward approximation functions;

obtaining the instantaneous power input corresponding to a region in the plurality of learning regions;

selecting a turn-on setting in the plurality of turn-on settings for the instantaneous power input based on a policy function;

applying a turn-on setting to the auxiliary PA path that is one of the selected turn-on setting and a turn-on setting in the plurality of turn-on settings other than the selected turn-on setting;

observing an updated instantaneous gain of the PA;

updating the reward model parameters using a regression analysis; and updating parameters for the policy function using a regression analysis.

15. The PA of claim 12, wherein the plurality of turn-on settings comprises eight distinct turn-on settings.

16. The PA of claim 12, wherein the Doherty PA is a mm-wave mixed-signal Doherty PA.

17. The PA of claim 14, wherein the plurality of turn-on settings comprises eight distinct turn-on settings.

18. The PA of claim 14, wherein the Doherty PA is a mm-wave mixed-signal Doherty PA.

* * * * *